United States Patent
Goto et al.

(10) Patent No.: US 8,735,222 B2
(45) Date of Patent: May 27, 2014

(54) SEMICONDUCTOR DEVICE AND METHOD OF MANUFACTURING THE SAME

(71) Applicant: Renesas Electronics Corporation, Kawasaki (JP)

(72) Inventors: Masakatsu Goto, Tokyo (JP); Minoru Enomoto, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 7 days.

(21) Appl. No.: 13/669,525

(22) Filed: Nov. 6, 2012

(65) Prior Publication Data
US 2013/0059420 A1    Mar. 7, 2013

Related U.S. Application Data

(62) Division of application No. 13/019,926, filed on Feb. 2, 2011, now Pat. No. 8,377,752.

(30) Foreign Application Priority Data

Feb. 5, 2010 (JP) ................................. 2010-024097

(51) Int. Cl.
*H01L 21/00* (2006.01)

(52) U.S. Cl.
USPC .................... 438/121; 438/126; 257/E21.506

(58) Field of Classification Search
USPC .......... 438/121, 124, 126, 113, 617; 257/737, 257/659, E21.506, E23.114
See application file for complete search history.

(56) References Cited

U.S. PATENT DOCUMENTS

| 7,394,663 B2 | 7/2008 | Yamashita et al. |
| 7,420,128 B2 | 9/2008 | Sunohara et al. |
| 8,130,507 B2 * | 3/2012 | Origuchi et al. ............. 361/760 |
| 2003/0116843 A1 * | 6/2003 | Iijima et al. ................. 257/700 |
| 2004/0056344 A1 | 3/2004 | Ogawa et al. |
| 2007/0119541 A1 | 5/2007 | Kawabata et al. |
| 2009/0008765 A1 | 1/2009 | Yamano et al. |
| 2009/0129037 A1 | 5/2009 | Yoshino |

FOREIGN PATENT DOCUMENTS

| JP | 2005-039094 A | 2/2005 |
| JP | 2006-049424 A | 2/2006 |
| JP | 2006-269594 A | 10/2006 |
| JP | 2007-150002 A | 6/2007 |
| JP | 2007-214535 A | 8/2007 |
| JP | 2008-010885 A | 1/2008 |

OTHER PUBLICATIONS

Office Action issued Jan. 22, 2013, in Japanese Patent Application No. 2010-024097.
Office Action issued Jul. 23, 2013, in Japanese Patent Application No. 2010-024097.

* cited by examiner

*Primary Examiner* — Chuong A Luu
*Assistant Examiner* — Nga Doan
(74) *Attorney, Agent, or Firm* — Miles & Stockbridge P.C.

(57) ABSTRACT

In regard to a semiconductor device having a multilayered wiring board where a semiconductor chip is embedded inside, a technology which allows the multilayered wiring board to be made thinner is provided. A feature of the present invention is that, in a semiconductor device where bump electrodes are formed over a main surface (element forming surface) of a semiconductor chip embedded in a chip-embedded wiring board, an insulating film is formed over a back surface (a surface on the side opposite to the main surface) of the semiconductor chip. As a result, it becomes unnecessary to form a prepreg over the back surface of the semiconductor chip. Therefore, an effect of thinning the chip-embedded wiring board in which the semiconductor chip is embedded is obtained.

6 Claims, 19 Drawing Sheets h1>h3>h2

SEMICONDUCTOR DEVICE AND METHOD OF MANUFACTURING THE SAME

CROSS-REFERENCE TO RELATED APPLICATIONS

The disclosure of Japanese Patent Application No. 2010-24097 filed on Feb. 5, 2010 including the specification, drawings and abstract is incorporated herein by reference in its entirety.

BACKGROUND OF THE INVENTION

The present invention relates to a semiconductor device and its manufacturing technique. In particular, it relates to a technique effectively applicable to a semiconductor device where a semiconductor chip is embedded inside a multilayered wiring board and its manufacturing technique.

There is disclosed in Japanese Unexamined Patent Publication No. 2007-214535 (Patent Document 1) a technique about a printed-wiring board with a built-in semiconductor element that has excellent adhesiveness to an overlying wiring board without being affected by insufficient sealing or excessive sealing. The printed-wiring board with a built-in semiconductor element is configured so that at least the lower surface is covered with an insulating film (insulating film 106), and that an insulating layer (insulating layer 108) is formed on the side and upper part of the semiconductor element. The method for manufacturing the printed-wiring board with a built-in semiconductor element comprises the steps of: mounting a semiconductor element onto a base board and covering at least a lower surface of the semiconductor element with an insulating film; laminating and stacking semi-cured insulating sheets on the side of the semiconductor element; and laminating and stacking semi-cured insulating sheets above an upper part of the semiconductor element.

According to Japanese Unexamined Patent Publication No. 2005-39094 (Patent Document 2), a cavity is provided inside a wiring board and a semiconductor chip is disposed inside the cavity. To be specific, for example, the semiconductor chip is arranged in the cavity through an adhesive resin. According to another embodiment, for example, a thermosetting adhesive tape is bonded to the back surface of the semiconductor chip.

According to Japanese Unexamined Patent Publication No. 2007-150002 (Patent Document 3), as shown in FIG. 29 of Patent Document 3, a back surface of the semiconductor IC is covered with a resin layer through a die attach film.

According to Japanese Unexamined Patent Publication No. 2008-10885 (Patent Document 4), as shown in FIGS. 26 and 27 of Patent Document 4, a semiconductor chip is bonded to a wiring board using a film-like resin (die attach film).

[Patent Document 1] Japanese Unexamined Patent Publication No. 2007-214535
[Patent Document 2] Japanese Unexamined Patent Publication No. 2005-39094
[Patent Document 3] Japanese Unexamined Patent Publication No. 2007-150002
[Patent Document 4] Japanese Unexamined Patent Publication No. 2008-10885

SUMMARY OF THE INVENTION

A semiconductor device comprises: a semiconductor chip where semiconductor elements such as a MOSFET (Metal Oxide Semiconductor Field Effect Transistor) and a multi-layered wiring are formed; and a package so formed as to cover the semiconductor chip. The package has functions such as (1) electrically coupling semiconductor elements formed in the semiconductor chip with an external circuit and (2) protecting the semiconductor chip from outside environments such as humidity and temperature, and preventing the semiconductor chip from being broken by vibration or shock and preventing its property from being deteriorated. The package also has functions of (3) enabling easy handling of the semiconductor chip and (4) dissipating heat during the operation of the semiconductor chip, and maximizing the performance of the semiconductor element.

In recent years, miniaturization of the semiconductor device has been called for, and efforts have been made to reduce the size of the package. For example, with regard to cellular phones etc., in particular, miniaturization and thinning of the package have been called for. In that kind of cellular phone, a plurality of semiconductor chips, such as a baseband IC chip, an RFIC chip, a power amplifier IC tip, and the like are required. When these semiconductor chips are packaged separately, it has become difficult to sufficiently miniaturize the size of the cellular phone. For this reason, such a method has been studied that a single package is made by mounting a plurality of semiconductor chips onto one wiring board. Thus, by putting the semiconductor chips into one package, the size of the package can be made smaller than the case where the semiconductor chips are packaged separately.

Furthermore, in order to reduce the package size, some of the semiconductor chips are embedded inside the wiring board (Embedded Package). Thus, by embedding some of the semiconductor chips in the wiring board, the number of semiconductor chips to be mounted over the surface of the wiring board can be reduced. As a result, the package can be reduced in size.

For the wiring board in which the semiconductor chip is embedded, a multilayered wiring board where a multilayered wiring is formed inside is used. In this case, internal wirings formed inside the multilayered wiring board are stacked through an interlayer insulator comprising a material called prepreg. For example, when a first internal wiring is formed in the multilayered wiring board, an interlayer insulator is formed over the first internal wiring. Then, a second internal wiring is formed over the interlayer insulator. Thus, multilayered internal wirings can be formed inside the multilayered wiring board.

When the semiconductor chip is being embedded in the multilayered wiring board, for example, the first internal wiring of the multilayered board is flip-chip bonded to the semiconductor chip with its face directed downward. To be specific, a main surface of the semiconductor chip is opposed to the first internal wiring, and a bump electrode formed over the main surface of the semiconductor chip is brought into contact with the first internal wiring. Thus, the semiconductor chip is electrically coupled with the first internal wiring. Then, an interlayer insulator comprising a prepreg is formed so as to cover the semiconductor chip coupled with the first interlayer wiring. Then, a second internal wiring is formed over the interlayer insulator. In this case, an upper surface (back surface) of the semiconductor chip is also covered with the interlayer insulator, and a second internal wiring is formed over the interlayer insulator. Thus, generally, the interlayer insulator is formed over the upper surface (back surface) of the embedded semiconductor chip. The film thickness of the interlayer insulator is about 40 μm. Therefore, in the case of the multilayered wiring board in which the semiconductor chip is embedded, the film thickness of the interlayer insulator formed over the upper surface (back surface) of the semiconductor chip must be secured, which prevents the multilayered wiring board where the semiconductor chip is embedded from becoming thinner.

An object of the present invention is to provide, in regard to a semiconductor device having a multilayered wiring board where a semiconductor chip is embedded, a technology which allows the multilayered wiring board to be made thinner.

The above and other objects as well as a novel feature of the present invention will be apparent from the description of the present specification and the accompanying drawings.

An outline of a representative one of the invention described in the present application will be explained briefly as follows.

A semiconductor device according to a representative embodiment comprises: (a) a multilayered wiring board having a first internal wiring and a second internal wiring formed over the first internal wiring; and (b) a first semiconductor chip embedded inside the multilayered wiring board. The first semiconductor chip has (b1) bump electrodes formed over a main surface of the first semiconductor chip and (b2) an insulating film formed over a back surface, which is on the side opposite to the main surface, of the first semiconductor chip. Further, the semiconductor device described above is arranged such that the main surface of the first semiconductor chip is opposed to the side of the first internal wiring formed over the multilayered wiring board. Also, the first internal wiring is coupled with the first semiconductor chip through the bump electrodes. At this time, the back surface of the first semiconductor chip is insulated from the second internal wiring by the insulating film.

Moreover, a method of manufacturing a semiconductor device according to a representative embodiment comprises the steps of: (a) preparing a semiconductor chip where a bump electrode is formed over a main surface and a thermosetting insulating film is formed over a back surface; and (b) preparing a base board which serves as a core of a multilayered wiring board and in which a first internal wiring is formed. The method further comprises the steps of: (c) applying a thermosetting resin to a chip mounting region of the base board; and (d) after the step (c), coupling the bump electrode formed over the semiconductor chip with the first internal wiring by mounting the semiconductor chip, while heating it, in the chip mounting region of the base board through the thermosetting resin. The method still further comprises the steps of: (e) after the step (d), applying a heat treatment; and (f) after the step (e), forming a first interlayer insulator so as to cover a side surface of the semiconductor chip and to allow the insulating film formed over the back surface, which is on an upper surface side of the semiconductor chip, to be exposed. The method still further comprises the steps of: (g) after the step (f), forming a second interlayer insulator covering from the first interlayer insulator to the semiconductor chip so that the conductive film may come in contact with the insulating film, the patterned conductive film being pasted to the upper part of the second interlayer insulator, and forming a second internal wiring comprising the conductor film so as to be directly in contact with the insulating film. At this time, by being heated in the steps (d) and (e), in a stage before the step (g), the insulating film is more cured than the insulating film in the step (a).

Moreover, a method of manufacturing a semiconductor device according to a representative embodiment comprises the steps of: (a) preparing a semiconductor chip where a bump electrode is formed over a main surface and a thermosetting insulating film is formed over a back surface; and (b) preparing a base board which serves as a core of a multilayered wiring board and in which a first internal wiring is formed. The method further comprises the steps of: (c) coupling the bump electrode formed over the semiconductor chip with the first internal wiring by mounting the semiconductor chip in a chip mounting region of the base board; and (d) after the step (c), performing a reflow treatment which is a heat treatment. The method still further comprises the steps of: (e) after the step (d), applying an underfill material into a gap between the semiconductor chip and the base board; (f) after the step (e), applying a heat treatment; and (g) after the step (f), forming a first interlayer insulator so as to cover a side surface of the semiconductor chip and to allow the insulating film formed over the back surface, which is on an upper surface side of the semiconductor chip, to be exposed. The method still further comprises the steps of: (h) after the step (g), forming a second interlayer insulator covering from the first interlayer insulator to the semiconductor chip so that the conductive film may come in contact with the insulating film, the patterned conductive film being pasted to the upper part of the second interlayer insulator, and forming a second internal wiring comprising the conductive film so as to be directly in contact with the insulating film. At this time, by being heated in the steps (d), (e), and (f), in a stage before the step (h), the insulating film is more cured than the insulating film in the step (a).

The effects brought about by the representative embodiments of the present invention disclosed herein are briefly described below.

In a semiconductor device having a multilayered wiring board where a semiconductor chip is embedded, the multilayered wiring board can be made thinner.

DESCRIPTION OF THE PREFERRED EMBODIMENTS

Figure 1:
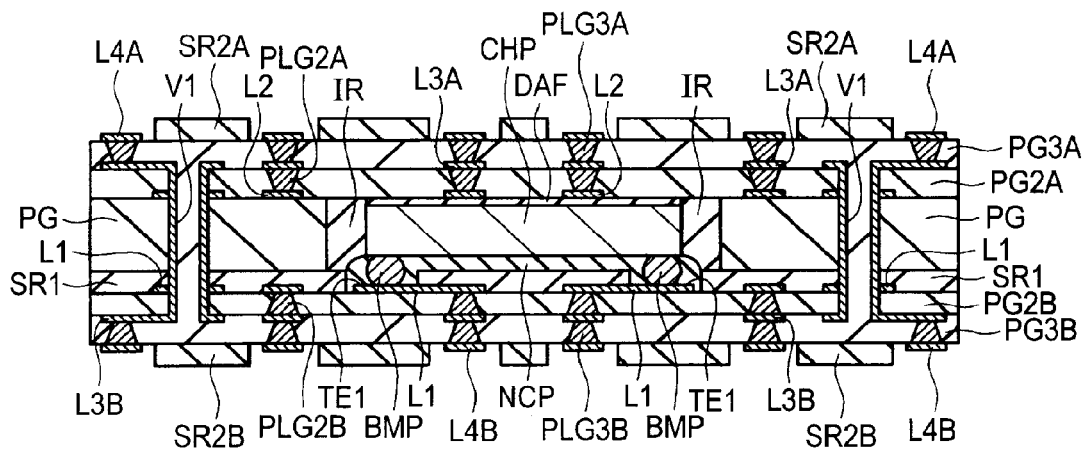
FIG. 1 is a cross-sectional view showing a configuration of a chip-embedded wiring board according to Embodiment 1 of the present invention.

The description of the embodiments may be divided into sections or the respective embodiments for convenience if necessary, but these embodiments are related to each other except when specified otherwise. One of the embodiments has a relationship with respect to the other so as to be a modified example of a part or all of the other, or a detailed part or a supplemental description of the other embodiment.

Further, when referring to the number of components or the like (including the number of pieces, the numerical value, the amount, the range, and the like), the embodiments are not limited to a specific value except when specified otherwise and except when clearly limited otherwise in principle, and thus may take a value equal to or more than, or less than the specific value.

In the preferred embodiments described below, it is needless to say that their constituent elements (including constituent steps) are not necessarily essential unless otherwise specified or considered theoretically essential.

Likewise, in the preferred embodiments described below, when a specific form or positional relation is indicated for an element, it should be interpreted to include forms or positional relations which are virtually equivalent or similar to the specific one unless otherwise specified or unless the specific one is considered theoretically necessary. The same can be said of numerical values or ranges as mentioned above.

In all the drawings that illustrate the preferred embodiments, elements with like functions are basically designated by like reference numerals and repeated descriptions thereof are omitted. For easy understanding, hatching may be used even in a plan view.

Embodiment 1

With reference to the drawings, a semiconductor device according to Embodiment 1 will be described. FIG. 1 is a cross-sectional view showing a configuration of a chip-embedded wiring board EMPAC1 according to Embodiment 1. In FIG. 1, with respect to the chip-embedded wiring board EMPAC1 according to Embodiment 1, a semiconductor chip CHP being a bear chip is embedded inside a multilayered wiring board in which a multilayered wiring is formed. To be specific, a wiring L1 is formed inside the multilayered wiring board, and a solder resist SR1 is formed so as to cover the wiring L1. Further, part of the wiring L1 is exposed from the solder resist SR1, and the exposed part of the wiring L1 serves as a terminal TE1.

The semiconductor chip CHP is mounted over the wiring L1 covered with the solder resist SR1. Semiconductor elements such as a MOSFET (Metal Oxide Semiconductor Field Effect Transistor) and the multilayered wiring are formed in the semiconductor chip CHP. The above semiconductor elements and the multilayered wiring form an integrated circuit.

In this regard, a gate insulating film of the MOSFET is not limited to an oxide film, and other insulating films such as a nitride film or the like may be included. Bump electrodes BMP are formed over a main surface (element forming surface) of the semiconductor chip CHP in which the integrated circuit is formed. The bump electrode BMP is electrically coupled, through the multilayered wiring formed inside the semiconductor chip CHP, with the semiconductor element formed inside the semiconductor chip CHP. That is, the bump electrode BMP formed over the semiconductor chip CHP functions as an external terminal for coupling the integrated circuit formed inside the semiconductor chip CHP with an external apparatus. The bump electrode BMP comprises materials such as gold, copper, and solder, for example.

The bump electrode BMP formed over the semiconductor chip CHP is electrically coupled with a terminal TE1 exposed from the solder resist SR1. That is, the semiconductor chip CHP is flip-chip bonded to the terminal TE1 through the bump electrode BMP. In other words, the semiconductor chip CHP is arranged such that the main surface (element forming surface) of the semiconductor chip CHP is opposed to the terminal TE1 side and is coupled with the terminal TE1 through the bump electrode BMP. At this time, a gap between the semiconductor chip CHP and the solder resist SR1 is filled with a resin NCP.

Although the semiconductor chip CHP is mounted over the solder resist SR1 which covers the wiring L1, a prepreg PG is formed over the solder resist SR1 over which the semiconductor chip CHP is not mounted. That is, although the semiconductor chip CHP is mounted over the terminal TE1 exposed from the solder resist SR1 through the bump electrode BMP, the prepregs PG are formed in outer regions sandwiching a mounting region in which the semiconductor chip CHP is mounted. The prepreg PG comprises a material in which a glass cloth is impregnated with epoxy resin. The prepregs PG are formed so as to sandwich surfaces of both the sides of the semiconductor chip CHP. In fact, an insulating layer IR is formed between the side surface of the semiconductor chip CHP and the prepreg PG. The insulating layer IR is formed of an epoxy resin oozed out from the prepreg PG. That is, the insulating layer IR directly in contact with the side surface of the semiconductor chip CHP is a layer formed, in a processing step in which the prepreg PG is formed over the solder resist SR1, when the epoxy resin oozes out from the prepreg PG comprising the material in which the glass cloth is impregnated with epoxy resin.

Next, an insulating film DAF is formed over a back surface (a surface on the side opposite to the main surface where the bump electrode BMP is formed) of the semiconductor chip CHP. The insulating film DAF includes, for example, a die attach film or a film in which a liquid resin is cured. As a material for the insulating film DAF, for example, an epoxy resin which is a thermosetting resin can be used. By forming the insulating film DAF over the back surface of the semiconductor chip CHP, the back surface of the semiconductor chip CHP can be insulated from the outside.

Further, the insulating film DAF formed over the back surface of the semiconductor chip CHP and the prepreg PG formed over the solder resist S121 are configured such that heights of respective surfaces coincide. In other words, the surface of the prepreg PG and the surface of the insulating film DAF formed over the back surface of the semiconductor chip CHP are substantially in the same plane.

Next, a wiring L2 is formed over the prepreg PG and the insulating film DAF whose heights of respective surfaces are the same. That is, the wiring L2 is so formed as to be directly in contact with the insulating film DAF formed over the back surface of the semiconductor chip CHP. In this regard, since the insulating film DAF is formed over the back surface of the semiconductor chip CHP, the semiconductor chip CHP is insulated from the wiring L2 by the insulating film DAF.

A prepreg PG2A is formed over the prepreg PG and the insulating film DAF so as to cover the wiring L2. A wiring L3A is formed over the prepreg PG2A. The wiring L3A formed over the prepreg PG2A is electrically coupled with the wiring L2 through a plug PLG2A formed in the prepreg PG2A. A prepreg PG3A is so formed over the prepreg PG2A as to cover the wiring L3A. A wiring L4A is formed over the prepreg PG3A. A Solder resist SR2A is so formed as to cover the prepreg PG3A where the wiring L4A is not formed.

On the other hand, a prepreg PG2B is formed in a layer under the wiring L1, and a plug PLG2B is formed so as to pass through the prepreg PG2B. Then, a wiring L3B is formed in a layer under the prepreg PG2B. The wiring L3B is electrically coupled with the wiring L1 through the plug PLG2B formed in the prepreg PG2B. Furthermore, a prepreg PG3B is formed in a layer under the prepreg PG2B so as to cover the wiring L3B. A wiring L4B is formed in a layer under the prepreg PG3B. A solder resist SR2B is formed in a layer under the prepreg PG3B where the wiring L4B is not formed.

In the chip-embedded wiring board EMPAC1, a through via V1 is so formed as to couple the wiring L3A with the wiring L3B. Thus, it is seen that, in the chip-embedded wiring board EMPAC1 according to Embodiment 1, the semiconductor chip CHP is embedded inside and that there are formed a plurality of wiring layers (the wirings L1, L2, L3A, L3B, L4A, L4B) and the through via V1.

A first feature of Embodiment 1 is that the insulating film DAF is formed over a back surface (a surface on the side opposite to the main surface where the bump electrode BMP is formed) of the semiconductor chip CHP embedded in the chip-embedded wiring board EMPAC1. As a result, the chip-embedded wiring board EMPAC1 in which the semiconductor chip CHP is embedded can be made thinner.

Figure 2:
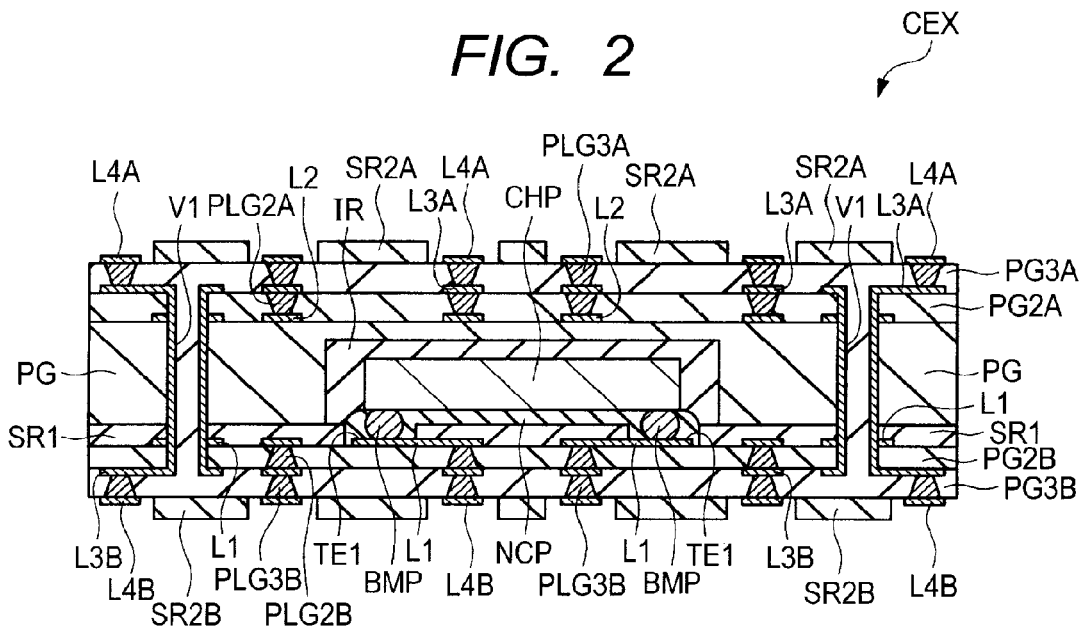
FIG. 2 is a cross-sectional view showing a configuration of a chip-embedded wiring board according to a comparative example.

By comparing with a comparative example, the reason will be explained. FIG. 2 is a cross-sectional view showing a configuration of a chip-embedded wiring board CEX in the comparative example. The chip-embedded wiring board EMPAC1 of Embodiment 1 shown in FIG. 1 differs from the chip-embedded wiring board CEX of the comparative example shown in FIG. 2 in its embedding configuration of the semiconductor chip CHP. To be specific, in regard to the chip-embedded wiring board CEX of the comparative example shown in FIG. 2, an insulating layer IR is so formed as to cover not only a side surface but also an upper surface (back surface) of the semiconductor chip CHP. Further, a prepreg PG is formed over the insulating layer IR which is formed over the upper surface (back surface) of the semiconductor chip CHP. Then, the wiring L2 is formed over the prepreg PG. Thus, according to the comparative example shown in FIG. 2, the insulating layer IR and the prepreg PG are formed over the upper surface (back surface) of the semiconductor chip CHP. The wiring L2 is formed through the insulating layer IR and the prepreg PG. That is, in the comparative example shown in FIG. 2, the wiring L2 cannot be directly formed over the back surface of the semiconductor chip CHP because the back surface of the semiconductor chip CHP is not insulated. Therefore, it is necessary to form the insulating layer IR and the prepreg PG so as to cover the back surface of the semiconductor chip CHP. For this reason, in the comparative example of FIG. 2, it is necessary to form the insulating layer IR and the prepreg PG over the back surface of the semiconductor chip CHP. Therefore, the chip-embedded wiring board CEX becomes thicker by the thicknesses of the insulating layer IR and the prepreg PG. In this regard, according to the comparative example, the prepreg PG is formed so as to cover the semiconductor chip CHP. Then, when processing the prepreg PG under heat and pressure, an epoxy resin oozes out from the prepreg PG and the insulating layer IR is formed. Therefore, when forming the prepreg PG so as to cover the back surface of the semiconductor chip CHP, the insulating layer IR and the prepreg PG are formed over the back surface of the semiconductor chip CHP. The prepreg PG is about 40 μm thick, for example. If the thickness of the insulating layer IR made by the oozed-out epoxy resin is added, it will be more than 40 μm thick.

On the other hand, in the chip-embedded wiring board EMPAC1 of Embodiment 1 shown in FIG. 1, the insulating film DAF is formed over the back surface of the semiconductor chip CHP. For this reason, it is not necessary to form the prepreg PG so as to cover the back surface of the semiconductor chip CHP for the purpose of insulating the back surface of the semiconductor chip CHP. That is, according to Embodiment 1 shown in FIG. 1, the insulating film DAF is formed over the back surface of the semiconductor chip CHP. Therefore, it is not necessary to further form a prepreg PG so as to cover the back surface of the semiconductor chip CHP. For this reason, the wiring L2 can be directly formed through the insulating film DAF over the back surface of the semiconductor chip CHP. Therefore, in the chip-embedded wiring board EMPAC1 of Embodiment 1 shown in FIG. 1, the prepreg PG is not formed so as to cover the back surface of the semiconductor chip CHP. Accordingly, the chip-embedded wiring board EMPAC1 can be made thinner that much.

As shown in FIG. 1, the prepreg PG formed in the same layer as the semiconductor chip CHP is only formed to sandwich the side surface of the semiconductor chip CHP with the insulating layers IR. In other words, the prepreg PG is not so formed as to cover the upper surface (back surface) of the semiconductor chip CHP.

That is, in the chip-embedded wiring board EMPAC1 of Embodiment 1 shown in FIG. 1, the wiring L2 is directly formed through the insulating film DAF formed over the back surface of the semiconductor chip CHP. Therefore, the chip-embedded wiring board EMPAC1 can be made thinner than the chip embedded wiring board CEX of the comparative example shown in FIG. 2.

In this regard, the thickness of each material is studied specifically. For example, when the insulating film DAF of Embodiment 1 is formed with use of a die attach film, the thickness of the die attach film will be about 5 μm to 20 μm. Therefore, it is seen that the thickness of the insulating film DAF can be reduced by more than one-half of the total thickness (40 μm or more) of the prepreg PG and the insulating layer IR in the comparative example. Moreover, the insulating film DAF of Embodiment 1 is not limited to the die attach film. For example, a film in which a liquid resin is cured may be used. Even in the case of the film where the liquid resin is cured, as in the case of the die attach film, the thickness of the chip-embedded board EMPAC1 in Embodiment 1 can be made thinner than that of the chip-embedded wiring board CEX in the comparative example shown in FIG. 2. In addition, the variation in film thickness of the die attach film is smaller than that of the film made by curing the liquid resin. Therefore, when the precision in board thickness is required, the die attach film may be used.

Thus, the first feature of Embodiment 1 is that, in a semiconductor device where a bump electrode BMP is formed over a main surface (element forming surface) of the semiconductor chip CHP which is embedded in a chip-embedded wiring board EMPAC1, an insulating film DAF is formed over a back surface (a surface on the side opposite to the main surface) of the semiconductor chip CHP. As a result, since it becomes unnecessary to form a prepreg PG over the back surface of the semiconductor chip CHP, an effect of thinning the chip-embedded wiring board EMPAC1 in which the semiconductor chip CHP is embedded can be obtained.

A second feature of Embodiment 1, which is related to the first feature, is that the wiring L2 can be directly formed over the back surface of the semiconductor chip CHP through the insulating film DAF. For example, in the comparative example shown in FIG. 2, since the insulating layer IR and the prepreg PG are formed over the back surface of the semiconductor chip CHP, the wiring L2 cannot be formed immediately above the semiconductor chip CHP. That is, in the comparative example, the insulating layer IR and the prepreg PG are formed immediately above the semiconductor chip CHP, and the wiring L2 is formed over the prepreg PG. This means that, unlike Embodiment 1 of FIG. 1, the wiring L2 cannot be routed in a region immediately above the semiconductor chip CHP. Therefore, in the comparative example shown in FIG. 2, the region immediately above the semiconductor chip CHP cannot be used effectively, being unable to sufficiently reduce the chip-embedded wiring board CEX in size. On the other hand, since the back surface of the semiconductor chip CHP is insulated by the insulating film DAF according to the chip-embedded wiring board EMPAC1 in Embodiment 1, the wiring L2 can be formed also in a region immediately above the semiconductor chip CHP. That is, according to the chip-embedded wiring board EMPAC1 in Embodiment 1, the region immediately above the back surface of the semiconductor chip CHP can be effectively used as a wiring forming region (wiring density can be raised). Therefore, the miniaturization of the chip-embedded wiring board EMPAC1 can be attained. Thus, according to Embodiment 1, the chip-embedded wiring board EMPAC1 can be made thinner and more compact.

According to Embodiment 1, for example, a die attach film can be used, for example, as an insulating film DAF formed over the back surface of the semiconductor chip CHP. Generally, the die attach film is used for fixing the semiconductor chip CHP. That is, the die attach film is used for the purpose of fixing the semiconductor chip CHP. However, Embodiment 1 includes a novel technical idea in that the die attach film is used not for fixing the semiconductor chip CHP but for electrically insulating the semiconductor chip CHP from the wiring L2. That is, in Embodiment 1, attention is focused on the point that the die attach film is formed from an insulating material and that it is a very thin film. Based on this point, according to Embodiment 1, the die attach film is used over the back surface (a surface on the side opposite to the main surface where the bump electrode BMP is formed) of the semiconductor chip CHP embedded in the chip-embedded wiring board EMPAC1. Accordingly, even if the prepreg PG is not formed over the back surface of the semiconductor chip CHP, electrical isolation between the back surface of the semiconductor chip CHP and the wiring L2 can be secured. As a result, the wiring L2 can be formed in a region immediately above the semiconductor chip CHP in contact with the die attach film, which can improve wiring density. Furthermore, since the die attach film is the very thin film, the chip-embedded wiring board EMPAC1 can be made thin. Thus, in Embodiment 1, the attention is focused on the die attach film's insulating nature and thinness. As a result of applying the die attach film to an objects (the object of securing the insulation and achieving thinness), which is different from an original object of the die attach film, a prominent effect of achieving thinness and compactness of the chip-embedded wiring board EMPAC1 can be obtained. However, the insulating film DAF formed over the back surface of the semiconductor chip CHP is not limited to the die attach film. Even with a film made by curing a liquid resin, insulation and thinness can be achieved.

Figure 3:
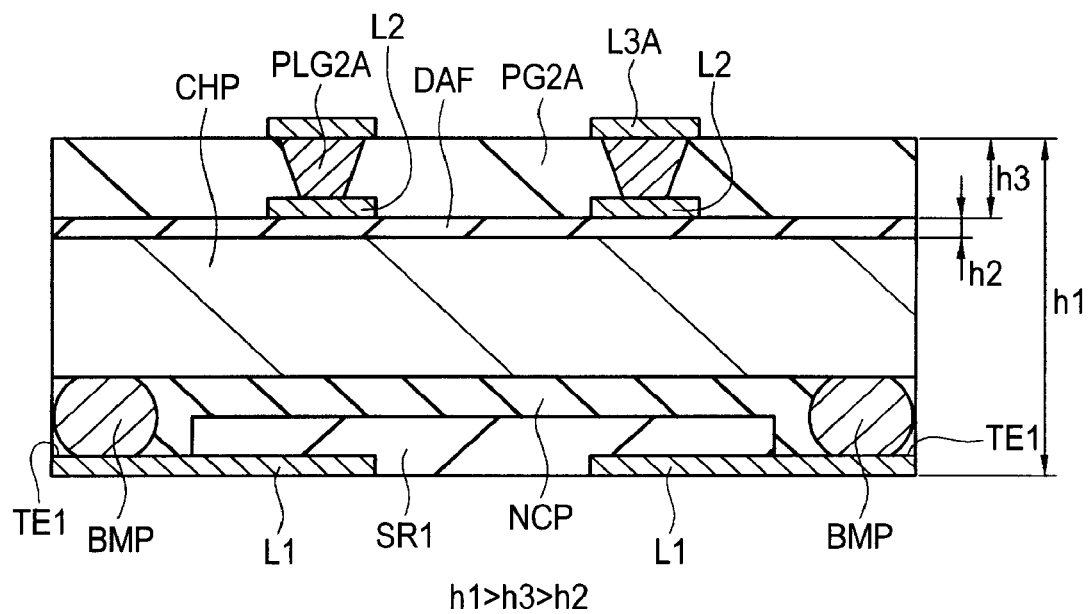
FIG. 3 is a cross-sectional view showing a configuration of a region near a semiconductor chip embedded in the chip-embedded wiring board of FIG. 1.

Next, with reference to FIG. 3, an explanation will be given of film-thickness conditions of the insulating film DAF formed over the back surface of the semiconductor chip CHP. FIG. 3 is a cross-sectional view showing, of the chip-embedded wiring board EMPAC1 shown in FIG. 1, a region where the semiconductor chip CHP is embedded in an enlarged manner. In FIG. 3, part of the region of the wiring L1 is covered with a solder resist SR1. A region of the wiring L1 not covered with the solder resist SR1 serves as a terminal TE1. Then, the bump electrode BMP formed over the main surface of the semiconductor chip CHP is in contact with the terminal TE1. That is, with the main surface where the bump electrode BMP is formed facing downward, the semiconductor chip CHP is flip-chip bonded to the terminal TE1. Also, the gap between the semiconductor chip CHP and the solder resist SR1 is filled with the resin NCP. On the other hand, the insulating film DAF is formed over the back surface (the surface on the side opposite to the main surface) of the semiconductor chip CHP. The wiring L2 is formed so as to be directly in contact with the insulating film DAF. The prepreg PG2A is formed so as to cover the wiring L2. Further, the wiring L3A is formed over the prepreg PG2A. The wiring L2 and the wiring L3A are electrically coupled by the plug PLG2A which passes through the prepreg PG2A.

In the chip-embedded wiring board EMPAC1 thus configured, assuming that a distance between the wiring L1 and the wiring L3A is h1, a film thickness of the insulating film DAF is h2, and a distance between the wiring L2 and the wiring L3A is h3, there is a relationship of h1>h3>h2. That is, the film thickness (h2) of the insulating film DAF formed over the back surface of the semiconductor chip CHP is smaller than the distance (h3) between the wiring L2 and the wiring L3A. In other words, it can be said that the film thickness (h2) of the insulating film DAF is smaller than that of the prepreg PG2A. Thus, by allowing the film thickness (h2) of the insulating film DAF to be smaller than the film thickness (h3) of the prepreg PG2A, the distance (h1) between the wiring L1 and the wiring L3A can be made shorter in the case where the insulating film DAF is formed over the back surface of the semiconductor chip CHP than in the case where the prepreg is formed over the back surface of the semiconductor chip CHP and the back surface of the semiconductor chip CHP and the wiring L2 are insulated. As a result, the chip-embedded wiring board EMPAC1 in which the semiconductor chip CHP is embedded can be made thin enough. That is, as in Embodiment 1, when the insulating film DAF is formed over the back surface of the semiconductor chip CHP, the film thickness of the insulating film DAF is chosen so as to satisfy the relationship of h1>h3>h2. In this way, the chip-embedded wiring board EMPAC1 can be effectively made thin.

FIG. 1 shows the wirings L1, L2, L3A, L3B, L4A, and L4B with respect to the chip-embedded wiring board EMPAC1. However, the chip-embedded wiring board EMPAC1 is not limited to the above. That is, the number of wiring layers may be greater or smaller than the one shown in FIG. 1.

Embodiment 2

In Embodiment 2, with reference to the drawings, an explanation will be given of a method for manufacturing the chip-embedded wiring board EMPAC1 described in Embodiment 1. In Embodiment 2, explanations will be given of the case where a gold bump electrode is used for the bump electrode to be formed over the semiconductor chip and the case where a solder bump electrode is used for the bump electrode to be formed over the semiconductor chip.

Figure 4:
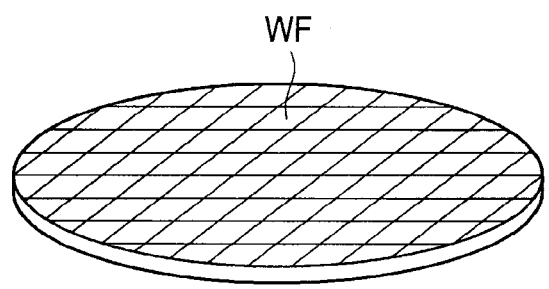
FIG. 4 shows a step of a semiconductor device manufacturing process according to Embodiment 2.
Figure 5:
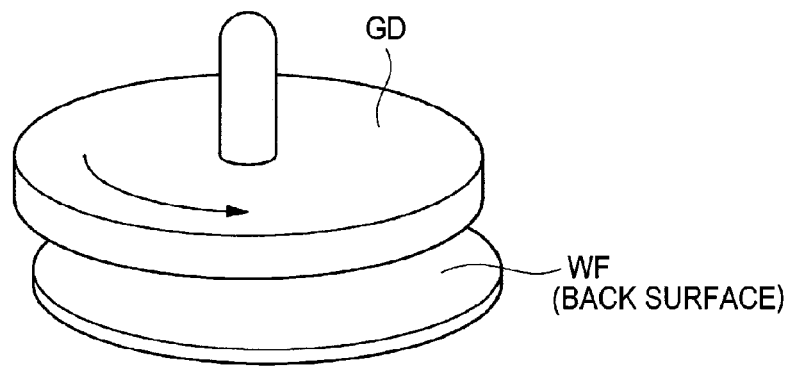
FIG. 5 shows a step of the semiconductor device manufacturing process after the step shown in FIG. 4.

First, an explanation will be given of a method of forming the bump electrode over the semiconductor chip from the gold bump electrode. As shown in FIG. 4, a substantially disc-like semiconductor wafer WF is prepared. The semiconductor wafer WF is divided into a plurality of chip regions according to dicing lines formed in a scribe region. Over the main surface of the semiconductor wafer WF, for each partitioned chip region, there are formed semiconductor elements such as a MOSFET and multilayered wirings for coupling those semiconductor elements. Then, as shown in FIG. 5, semiconductor wafer WF is made thinner by polishing the back surface of the semiconductor wafer WF, for example, with use of a grinder GD.

Figure 6:
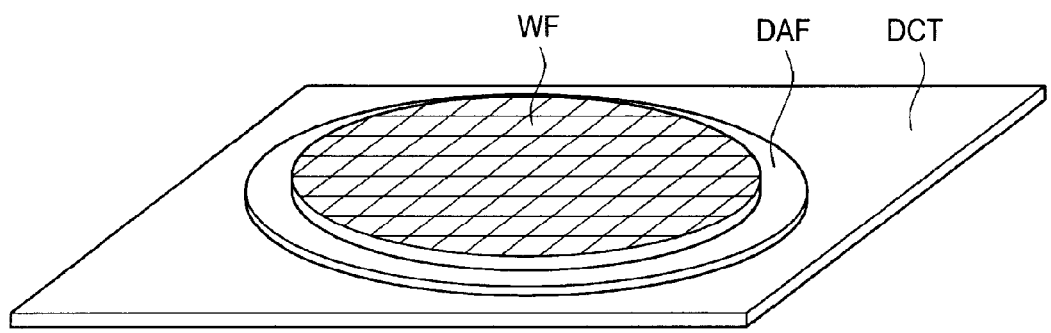
FIG. 6 shows a step of the semiconductor device manufacturing process after the step shown in FIG. 5.

Next, as shown in FIG. 6, for example, an insulating film DAF comprising a die attach film is bonded to the back surface of the semiconductor wafer WF. The die attach film included in the insulating film DAF is often integral with a dicing tape DCT, and is larger in a circular or rectangular form than the semiconductor wafer WF. Its film thickness is about 5 μm to 20 μm. The die attach film included in the insulating film DAF is formed from a thermosetting resin cured by heating. For a resin of such a type, epoxy resin is often used.

Figure 7:
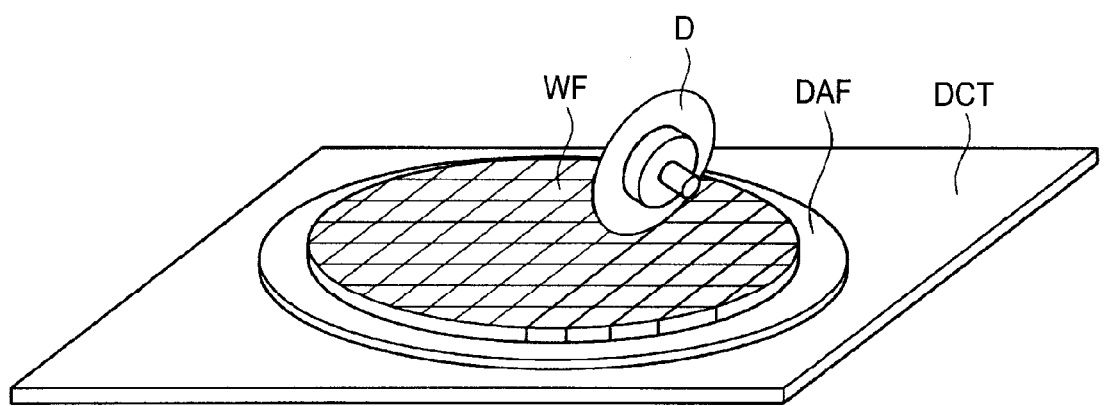
FIG. 7 shows a step of the semiconductor device manufacturing process after the step shown in FIG. 6.
Figure 8:
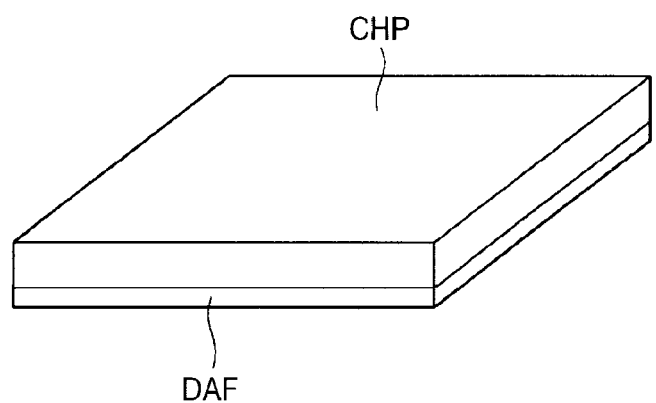
FIG. 8 shows a step of the semiconductor device manufacturing process after the step shown in FIG. 7.

Then, as shown in FIG. 7, the semiconductor wafer WF having the back surface to which the insulating film DAF is bonded is diced by a dicing saw D. This dicing is performed along dicing lines formed in the scribe region of the semiconductor wafer WF. As shown in FIG. 8, as a result of the above dicing, each chip region of the semiconductor wafer WF is divided into separate semiconductor chips CHP. Each separate piece of the semiconductor chip CHP is picked up from the dicing tape DCT. As shown in FIG. 8, the insulating film DAF comprising the die attach film is bonded to the back surface in the rectangular form.

Figure 9:
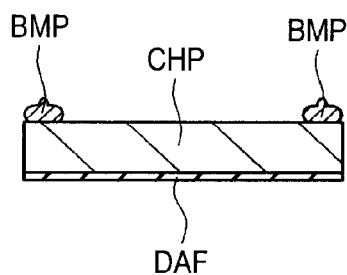
FIG. 9 is a cross-sectional view showing a step of the semiconductor device manufacturing process after the step shown in FIG. 8.

Then, as shown in FIG. 9, over the main surface of the semiconductor chip CHP, a bump electrode (projected electrode) BMP comprising a gold material is formed. To be specific, from the main surface of the semiconductor chip CHP, there is exposed a pad (not shown) which is electrically coupled with a semiconductor element formed therein. The bump electrode BMP is formed over the pad. At this time, the bump electrode BMP comprising the gold material is formed, for example, by a capillary with use of ultrasonic waves and heat. The bump electrode BMP thus formed using the capillary is called a stud bump electrode. As described above, there is obtained the semiconductor chip CHP where the bump electrode BMP is first formed over the main surface and the insulating film DAF is bonded to the back surface.

Figure 10:
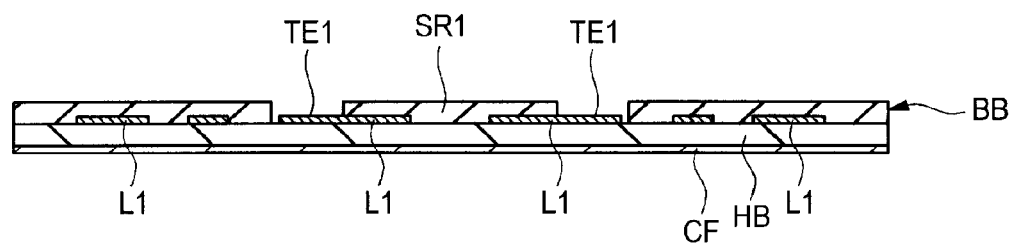
FIG. 10 is a cross-sectional view showing a step of the semiconductor device manufacturing process after the step shown in FIG. 9.

Next, as shown in FIG. 10, a base board BB used as a core of the chip-embedded wiring board EMPAC1 is prepared. In the base board BB, for example, a wiring L1 is formed over an upper surface of a support board HB comprising a prepreg where a copper film CF is pasted to an undersurface thereof. A solder resist SR1 is formed so as to cover the wiring L1. The wiring L1 includes, for example, a copper film. Part of the wiring L1 is exposed from the solder resist SR1, and the exposed part of the wiring L1 serves as a terminal TE1.

Figure 11:
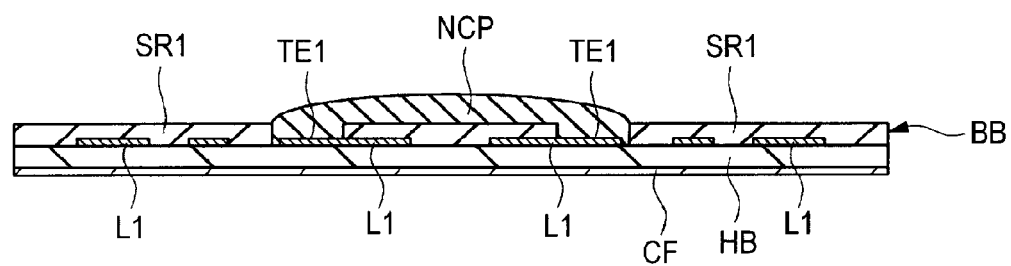
FIG. 11 is a cross-sectional view showing a step of the semiconductor device manufacturing process after the step shown in FIG. 10.

Then, as shown in FIG. 11, to a chip mounting region over the upper surface of the base board BB, a resin NCP called an in-advance applying resin is applied. The resin NCP is so formed as to cover the wiring L1, the solder resist SR1, and the terminal TE1 formed in the chip mounting region. The resin NCP is formed from a non-conductive paste-like resin (Non Conductive Paste).

Figure 12:
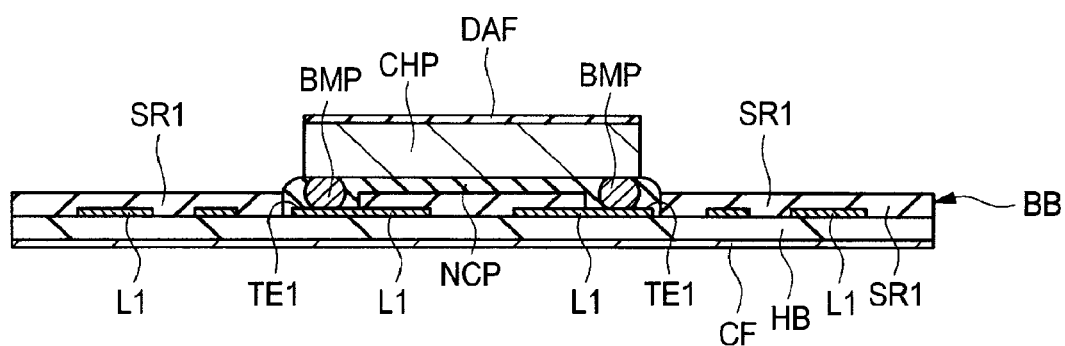
FIG. 12 is a cross-sectional view showing a step of the semiconductor device manufacturing process after the step shown in FIG. 11.

As shown in FIG. 12, the semiconductor chip CHP is mounted in the chip mounting region of the base board BB to which the resin NCP is applied. The step of mounting the semiconductor chip CHP onto the base board BB is performed while heating. To be specific, the semiconductor chip CHP is mounted onto the base board BB such that the bump electrode BMP formed over the main surface of the semiconductor chip CHP is in contact with the terminal TE1 formed in the base board BB. In other words, the main surface of the semiconductor chip CHP is flip-chip bonded to the side of the base board BB. As a result, the bump electrode BMP formed over the semiconductor chip CHP is electrically coupled with the terminal TE1 formed in the base board BB. Therefore, an integrated circuit formed inside the semiconductor chip CHP is electrically coupled with the wiring L1 through a contact between the bump electrode BMP and the terminal TE1. Thus, the semiconductor chip CHP is mounted over the base board BB with the main surface of the semiconductor chip CHP facing downward. As a result, the back surface of the semiconductor chip CHP faces upward. That is, the insulating film DAF formed over the back surface of the semiconductor chip CHP is arranged on the upper surface side. After the semiconductor chip CHP is mounted over the base board BB, cure bake (heat treatment) is performed.

Figure 13:
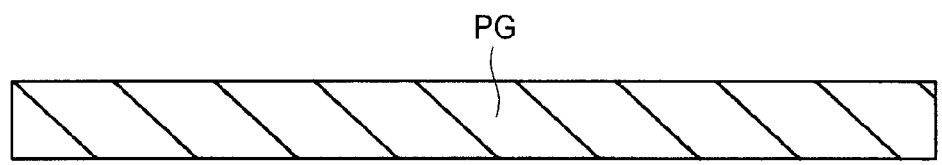
FIG. 13 is a cross-sectional view showing a step of the semiconductor device manufacturing process after the step shown in FIG. 12.
Figure 14:
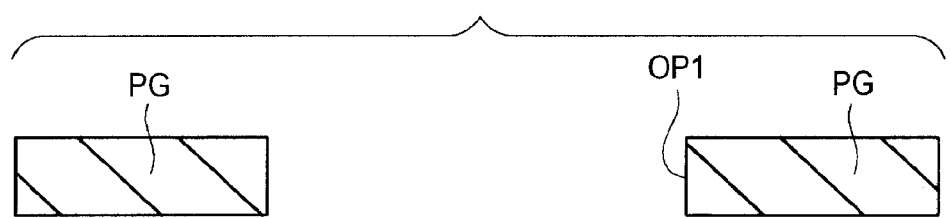
FIG. 14 is a cross-sectional view showing a step of the semiconductor device manufacturing process after the step shown in FIG. 13.
Figure 15:
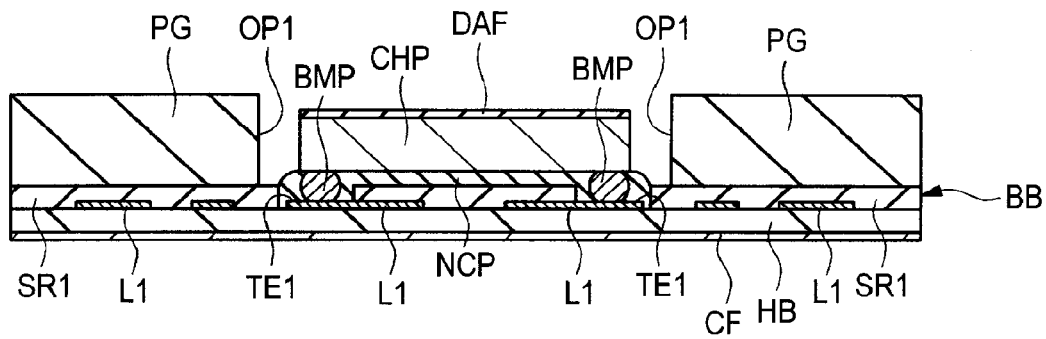
FIG. 15 is a cross-sectional view showing a step of the semiconductor device manufacturing process after the step shown in FIG. 14.

In this regard, as shown in FIG. 13, a prepreg PG to be an interlayer insulator for the chip-embedded wiring board EMPAC1 is prepared. The prepreg PG is formed, for example, from a material in which a glass cloth is impregnated with epoxy resin. Then, as shown in FIG. 14, an opening OP1 is formed in the prepreg PG by die-cutting the prepreg PG. Then, as shown in FIG. 15, over the base board BB where the semiconductor chip CHP is mounted, the prepreg PG in which the opening OP1 is formed is mounted. At this time, the prepreg PG is arranged such that the semiconductor chip CHP is housed in the opening OP1 formed in the prepreg PG. The position of an upper surface of the prepreg PG is a little higher than the position of the insulating film DAF formed over the back surface (upper surface) of the semiconductor chip CHP. In addition, the size of the opening OP1 formed in the prepreg PG is larger than the size of the semiconductor chip CHP, and there is a gap between a side surface of the semiconductor chip CHP and a side surface of the prepreg PG.

Figure 16:
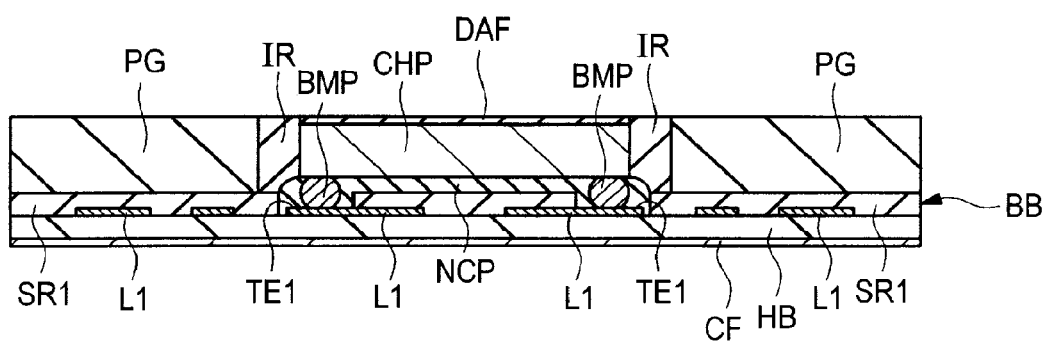
FIG. 16 is a cross sectional view showing a step of the semiconductor device manufacturing process after the step shown in FIG. 15.

Then, as shown in FIG. 16, the prepreg PG formed over the base board BB is shaped by being heated and pressed. By heating and pressing at this time, the height of the upper surface of the prepreg PG comes to coincide with the height of the upper surface of the insulating film DAF. Furthermore, the epoxy resin oozes out from the prepreg PG. The oozed-out epoxy resin fills the gap formed between the side surface of the semiconductor chip CHP and the side surface of the prepreg PG. That is, an insulating layer IR comprising the epoxy resin is formed in the gap. Thus, it becomes possible to form, over the base board BB, the prepreg PG whose height coincides with the height of the semiconductor chip CHP.

Figure 17:
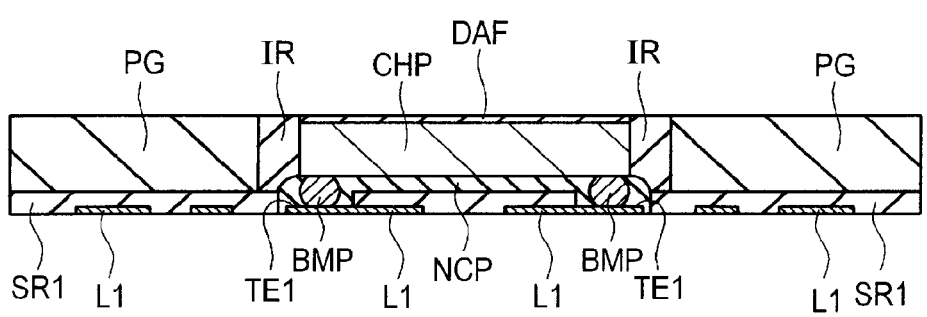
FIG. 17 is a cross-sectional view showing a step of the semiconductor device manufacturing process after the step shown in FIG. 16.
Figure 18:
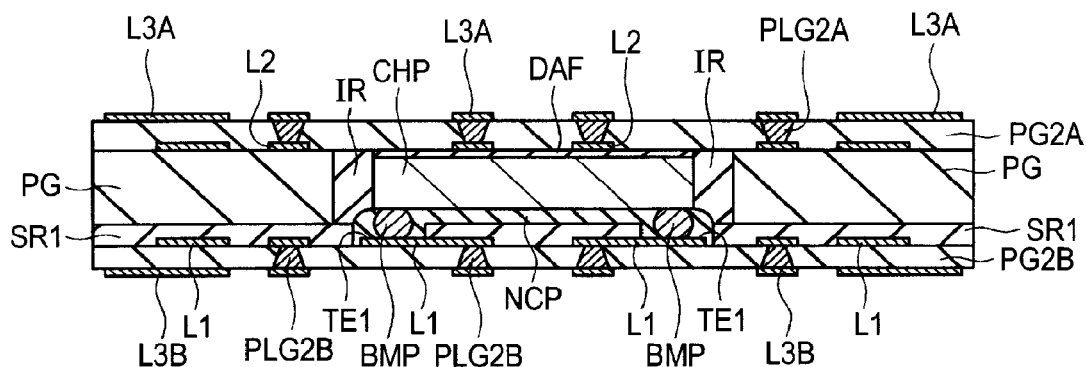
FIG. 18 is a cross-sectional view showing a step of the semiconductor device manufacturing process after the step shown in FIG. 17.

Next, as shown in FIG. 17, the support board HB and the copper film CF included in the base board BB are peeled off. As a result, there remains a basic structure alone in which the prepreg PG and the semiconductor chip CHP are mounted over the solder resist SR1 which covers the wiring L1. Then, as shown in FIG. 18, by heating and pressing, a prepreg PG2A is pasted to an upper surface of the basic structure and a prepreg PG2B is pasted to an undersurface of the basic structure. In this regard, a wiring L2 including a copper film is formed over one side of the prepreg PG2A to be pasted to the upper surface of the basic structure. A wiring L3A including a copper film is also formed over the other surface of the prepreg PG2A. Furthermore, a plug PLG2A is so formed as to pass through the prepreg PG2A. Through the plug PLG2A, the wiring L2 formed over one surface of the prepreg PG2A is electrically coupled with the wiring L3A formed over the other surface. The prepreg PG2A where the wirings L2 and L3A are formed is pasted such that the wiring L2 is in contact with the semiconductor chip CHP and the prepreg PG. Therefore, the wiring L2 is arranged so as to be directly in contact with the insulating film DAF formed over the back surface of the semiconductor chip CHP. In Embodiment 2, the insulating film DAF is formed between the semiconductor chip CHP and the wiring L2. Therefore, the isolation between the semiconductor chip CHP and the wiring L2 is secured. On the other hand, a wiring L3B including a copper film is formed over one surface of the prepreg PG2B pasted to the undersurface of the basic structure. Furthermore, the plug PLG2B is formed so as to pass through the prepreg PG2B. Through the plug PLG2B, the wiring L1 is electrically coupled with the wiring L3B formed over one surface of the prepreg PG2B. The prepreg PG2B where the wiring L3B is formed is pasted such that the wiring L3B faces downward.

Figure 19:
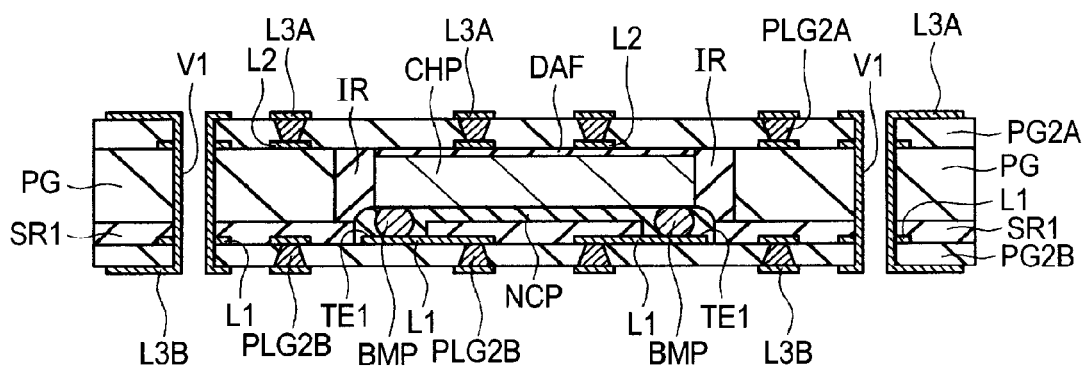
FIG. 19 is a cross-sectional view showing a step of the semiconductor device manufacturing process after the step shown in FIG. 18.

Then, as shown in FIG. 19, a through hole is formed so as to pass through the prepreg PG2A, prepreg PG, and prepreg PG2B. Then, by using the plating method, for example, a through via V1 is formed by forming a conductive film including a copper film or the like over an inner wall of the through hole. Thus, it becomes possible to electrically couple the wirings L3A, L2, L1 formed over the prepreg PG2A, and the wiring L3B formed over the prepreg PG2B with each other.

Figure 20:
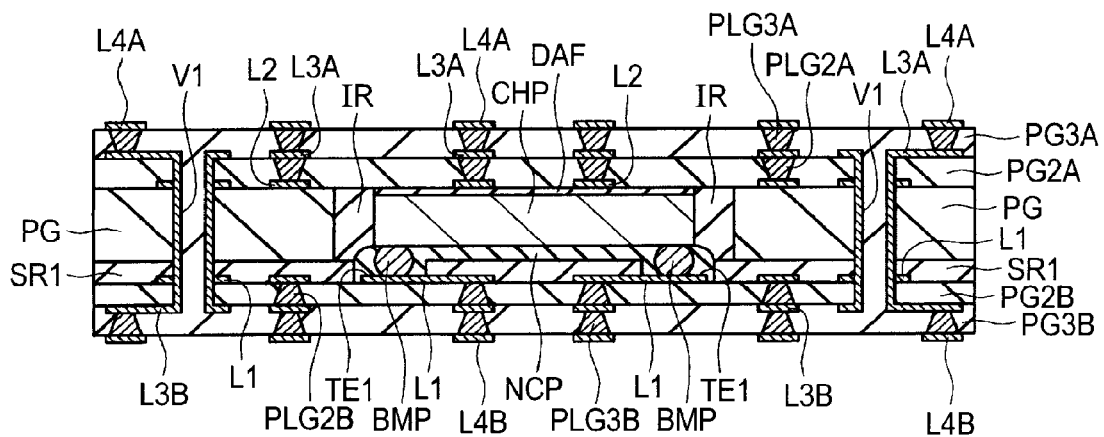
FIG. 20 is a cross-sectional view showing a step of the semiconductor device manufacturing process after the step shown in FIG. 19.

Then, as shown in FIG. 20, by heating and pressing, the prepreg PG3A is pasted to the upper surface of the prepreg PG2A. Also, a prepreg PG3B is pasted to a lower surface of the prepreg PG2B. In this regard, a wiring L4A including a copper film is formed over one surface of the prepreg PG3A to be pasted to the upper surface of the prepreg PG2A. Furthermore, a plug PLG3A is formed so as to pass through the prepreg PG3A. The prepreg PG3A where the wiring L4A is formed is pasted such that the wiring L3A faces the upper surface. Thus, through the plug PLG3A formed in the prepreg PG3A, the wiring L3A formed over the prepreg PG2A is electrically coupled with the wiring L4A formed over the prepreg PG3A. On the other hand, a wiring L4B including a copper film is formed over one surface of the prepreg PG3B to be pasted to the lower surface of the prepreg PG2B. Furthermore, the plug PLG3B is formed so as to pass through the prepreg PG3B. The prepreg PG3B where the wiring L4B is formed is pasted such that the wiring L3B faces the lower surface. Thus, through the plug PLG3B formed in the prepreg PG3B, the wiring L3B formed over the prepreg PG2B and the wiring L4B formed over the prepreg PG3B are electrically coupled.

Lastly, as shown in FIG. 1, a solder resist SR2A is formed over the upper surface of the prepreg PG3A, and the solder resist SR2A is subjected to patterning. The patterning is performed such that the solder resist SR2A remains in a region where the wiring L4A is not formed. Likewise, a solder resist SR2B is formed over a lower surface of the prepreg PG3B, and the solder resist SR2B is patterned. The patterning is performed such that the solder resist SR2B remains in a region where the wiring L4B is not formed. As described above, the chip-embedded wiring board EMPAC1 of Embodiment 1 can be produced The feature of the method for manufacturing the chip-embedded wiring board EMPAC1 of Embodiment 2 is that the insulating film DAF comprising the thermosetting resin is formed over the back surface of the semiconductor chip CHP, and the insulating film DAF is heat-treated before a stage where the wiring L2 is arranged so as to be directly in contact with the insulating film DAF formed over the back surface of the semiconductor chip CHP. Thus, the wiring L2 is arranged over the insulating film DAF with the insulating film comprising the thermosetting resins being cured. Therefore, even when pressure is given to the prepreg PG2A where the wiring L2 is formed, it is possible to prevent the wiring L2 from entering the insulating film DAF and coming into contact with the semiconductor chip CHP in a layer below the insulating film DAF.

For example, a case is considered where the insulating film DAF comprising the thermosetting resin is not heat-treated until a stage immediately before arranging the prepreg PG2A where the wiring L2 is formed over the semiconductor chip CHP. In this case, a heat treatment is not given to the insulating film DAF and the insulating film DAF is in an uncured state. In this state, there is arranged a prepreg PG2A where the wiring L2 is formed over the semiconductor chip CHP, and the prepreg PG2A is shaped by heating and pressing. As a result, the wiring L2 is pressed to the insulating film DAF through the pressure treatment to the prepreg PG2A. In this regard, the insulating film DAF is not cured and is in a softened state. Therefore, when the wiring L2 is pressed to the insulating film DAF, the wiring L2 enters the inside of the insulating film DAF to be in contact with the semiconductor chip CHP in the layer below the insulating film DAF. In this case, there occurs a short circuit between the semiconductor chip CHP and the wiring L2.

In this case, even when the insulating film DAF including the thermosetting resin is not heat-treated until a stage immediately before the prepreg PG2A where the wiring L2 is formed is arranged, the prepreg PG2A is shaped by being given heat and pressure. Because of the heat treatment, the insulating film DAF including the thermosetting resin is cured. Therefore, it is conceivable that even when the wiring L2 is pressed to the insulating film DAF, the wiring L2 does not enter the inside of the cured insulating film DAF and that it becomes possible to prevent the occurrence of a short circuit between the semiconductor chip CHP and the wiring L2.

Generally, when heated, the thermosetting resin once turns to be in a state of having low viscosity. Then, it is cured by polymerization. Therefore, when the insulating film DAF comprising the thermosetting resin is not heat-treated until the stage immediately before the prepreg PG2A where the wiring L12 is formed is disposed, if heating and pressing treatments are applied to the prepreg PG2A, the insulating film DAF comes to be soft and have low viscosity. In this state, when the wiring L2 is pressed to the insulating film DAF, the wiring L2 enters the inside of the insulating film DAF. Then, the semiconductor chip CHP in the layer below the insulating film DAF comes into contact with the wiring L2, causing a short circuit.

Therefore, according to Embodiment 2, in the stage before the prepreg PG2A where the wiring L2 is formed is arranged over the insulating film DAF, the insulating film DAF is heat-treated. Consequently, the insulating film DAF comprising the thermosetting resin is cured. Thus, according to Embodiment 2, in the state where the insulating film DAF comprising the thermosetting resins is cured, the wiring L2 is arranged over the insulating film DAF. Therefore, even if pressure is given to the prepreg PG2A where the wiring L2 is formed, it becomes possible to prevent the wiring L2 from entering the insulating film DAF and coming into contact with the semiconductor chip CHP in the layer under the insulating film DAF.

To be specific, according to Embodiment 2, for example, in a stage before the semiconductor chip CHP shown in FIG. 12 is mounted onto the base board BB, the insulating film DAF comprising the thermosetting resin is heat-treated. With use of a flowchart, a process from a step of preparing the semiconductor wafer WF to a step of mounting the semiconductor chip CHP onto the base board BB will be shown. Further, an explanation will be given of in which step a heat load is added to the insulating film DAF.

Figure 21:
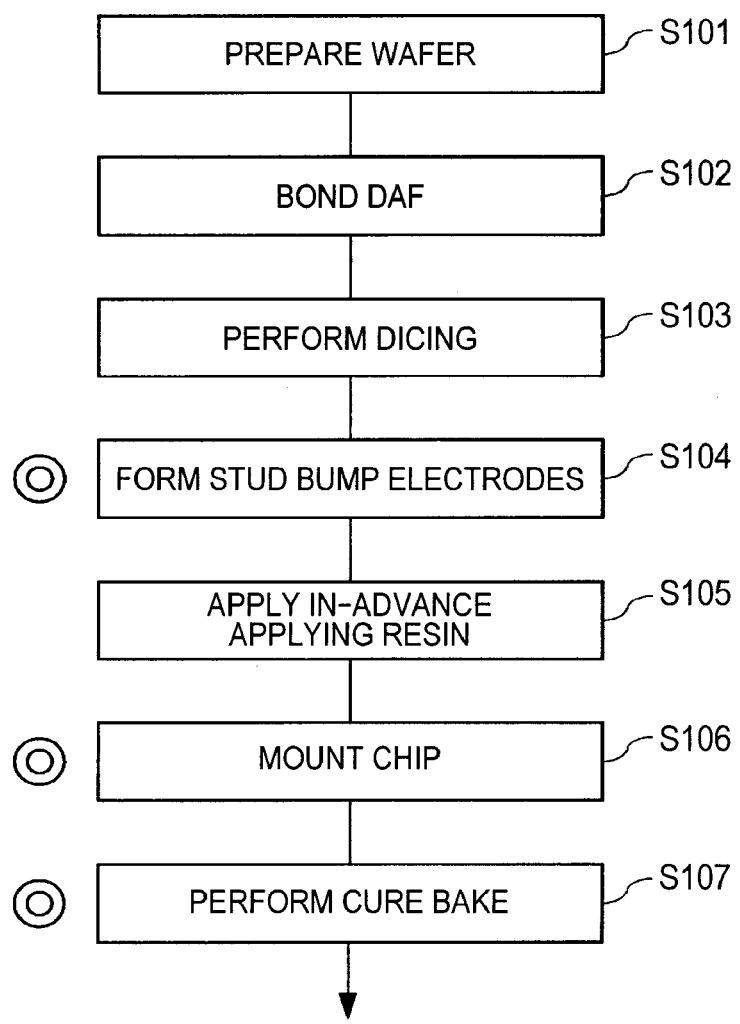
FIG. 21 is a flowchart showing a flow of the semiconductor device manufacturing process according to Embodiment 2.

FIG. 21 is a flowchart which shows a flow from the step of preparing the semiconductor wafer WF to the step of mounting the semiconductor chip CHP onto the base board BB. In FIG. 21, first, the semiconductor wafer WF is prepared (S101). Then, to the back surface of the semiconductor wafer WF, the insulating film DAF comprising the thermosetting resin is bonded (S102). Next, the dicing of the semiconductor wafer WF is performed (S103). Then, over a main surface of the semiconductor chip CHP obtained by dicing, bump electrodes BMP are formed using a capillary (S104). In this step, the bump electrodes BMP are formed over the main surface of the semiconductor chip CHP using the capillary while heating. Therefore, in this step, a heat treatment is given to the insulating film DAF bonded to the back surface of the semiconductor chip CHP. That is, because of the heat treatment applied when the bump electrode is formed over the main surface of the semiconductor chip CHP, a heat treatment is also given to the insulating film DAF bonded to the back surface of the semiconductor chip CHP.

Next, the base board BB is prepared. Further, a resin NCP to be applied in advance is applied over a chip mounting region of the base board BB (S105). Then, the semiconductor chip CHP is mounted over the base board BB to which the resin NCP is applied (S106). At this time, while being heat-treated, the semiconductor chip CHP is mounted onto the base board BB. Therefore, in this step also, the insulating film DAF bonded to the back surface of the semiconductor chip CHP is heat-treated.

Then, cure bake is performed (S107). The cure bake is a heat treatment. Therefore, in this step also, the heat treatment is given to the insulating film DAF bonded to the back surface of the semiconductor chip CHP. As described above, according to Embodiment 2, it is seen that in a stage from the step of preparing the semiconductor wafer WF to the step of mounting the semiconductor chip CHP onto the base board BB, the insulating film DAF is heat-treated in the steps marked by double circles in FIG. 21. Therefore, by undergoing the process from the step of preparing the semiconductor wafer WF to the step of mounting the semiconductor chip CHP onto the base board BB, the film quality of the insulating film DAF can be more hardened than the film quality of the insulating film DAF immediately after it is bonded to the back surface of the semiconductor wafer.

As described above, according to Embodiment 2, it is seen that, in the stage before the prepreg PG2A where the wiring L2 is formed is arranged over the insulating film DAF, the insulating film DAF can be heated. For this reason, according to Embodiment 2, the wiring L2 is arranged over the insulating film DAF while the insulating film DAF comprising the thermosetting resin is cured. Therefore, even when a pressure treatment is given to the prepreg PG2A where the wiring L2 is formed, the wiring L2 can be prevented from entering the insulating film DAF and coming into contact with the semiconductor chip CHP in the layer under the insulating film DAF.

Next, a method of producing bump electrodes from solder bump electrodes, which are to be formed over the semiconductor chip, will be described. As shown in FIG. 4, a substantially disc-like semiconductor wafer WF is prepared. The semiconductor wafer WF is divided into a plurality of chip regions by dicing lines formed in a scribe region. Over the main surface of the semiconductor wafer WF, for each of the separate chip regions, there are formed semiconductor elements such as a MOSFET and a multilayered wiring for coupling these semiconductor elements. Then, as shown in FIG. 5, the semiconductor wafer WF is made thinner, for example, by polishing the back surface of the semiconductor wafer WF by a grinder GD.

Figure 22:
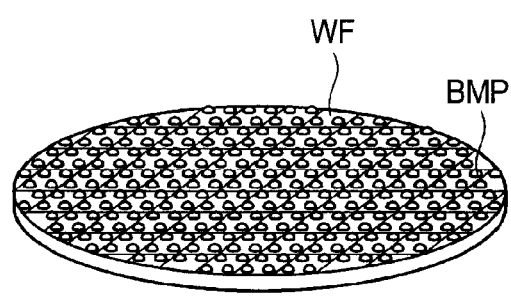
FIG. 22 shows a step of the semiconductor device manufacturing process according to Embodiment 2.

Then, as shown in FIG. 22, bump electrodes BMP comprising solders are formed over the main surface of the semiconductor wafer WF. The bump electrodes BMP comprising the solder are formed over the semiconductor wafer WF, for example, by the solder printing method or a method of mounting solder balls.

Figure 23:
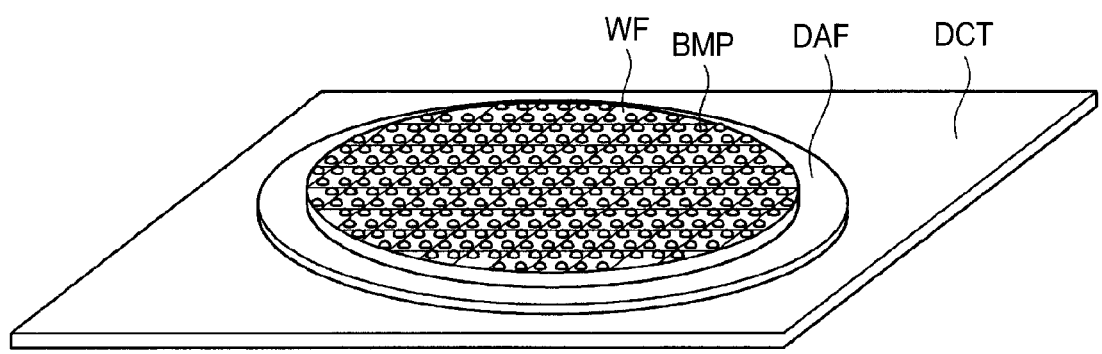
FIG. 23 shows a step of the semiconductor device manufacturing process after the step shown in FIG. 22.

Next, as shown in FIG. 23, to the back surface of the semiconductor wafer WF, for example, an insulating film DAF including a die attach film is bonded. The die attach film included in the insulating film DAF is in the form of a rectangle larger than the semiconductor wafer WF, and its film thickness is about 5 μm to 20 μm. The die attach film included in the insulating film DAF is formed from the thermosetting resin which is cured by being heated.

Figure 24:
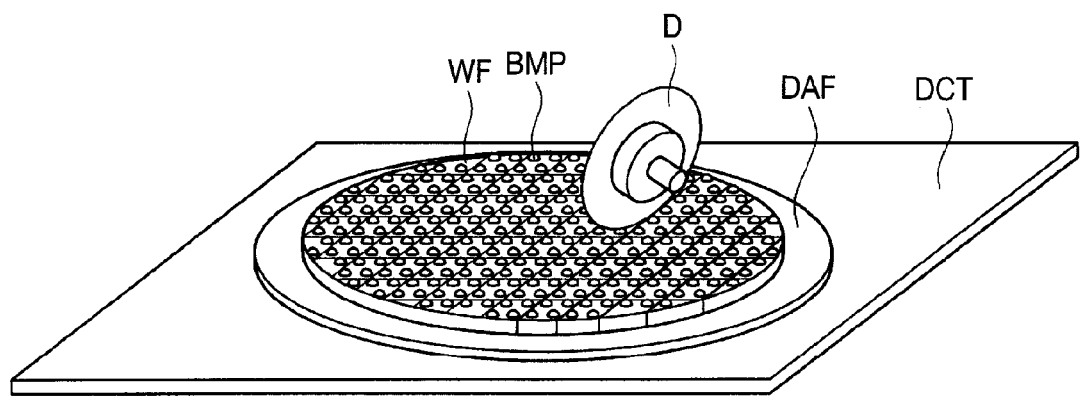
FIG. 24 shows a step of the semiconductor device manufacturing process after the step shown in FIG. 23.
Figure 25:
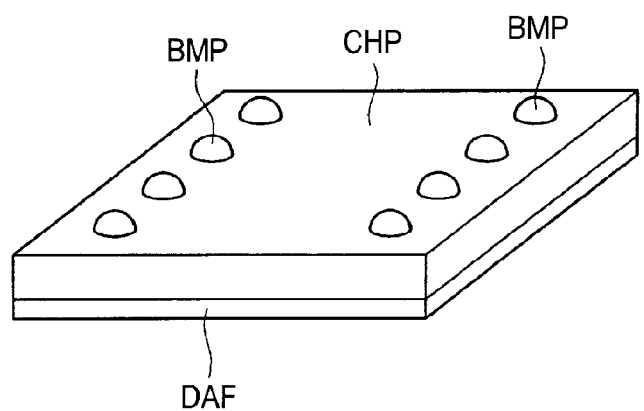
FIG. 25 shows a step of the semiconductor device manufacturing process after the step shown in FIG. 24.

Then, as shown in FIG. 24, the semiconductor wafer WF with the insulating film DAF being bonded to its back surface is given dicing by a dicing saw D. The dicing is performed along the dicing lines formed in the scribe region of the semiconductor wafer WF. By the dicing, as shown in FIG. 25, each chip region of the semiconductor wafer WF is divided into separate semiconductor chips CHP. Then, the separate semiconductor chips CHP are picked up from the dicing tape DCT. Further, as shown in FIG. 25, the insulating film DAF comprising the die attach film is bonded to the back surface in the form of a rectangle. On the other hand, over the main surface of the semiconductor chip CHP, a plurality of bump electrodes BMP are formed.

Figure 26:
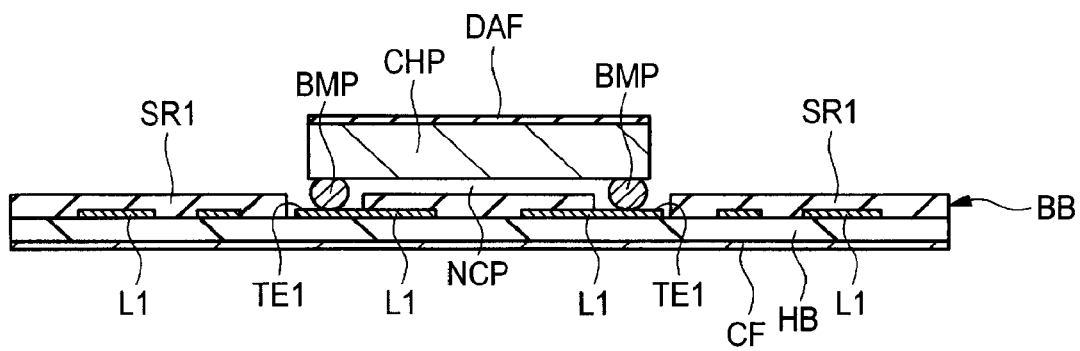
FIG. 26 is a cross-sectional view showing a step of the semiconductor device manufacturing process after the step shown in FIG. 25.

Next, as shown in FIG. 26, there is prepared a base board BB used as a core of the chip-embedded wiring board EMPAC1. In regard to the base board BB, for example, wirings L1 are formed over an upper surface of a support board HB comprising a prepreg the upper surface of which a copper film CF is pasted to. A solder resist SR1 is formed so as to cover the wiring L1. The wiring L1 includes, for example, a copper film. Part of it is exposed from the solder resist SR1, and the exposed portion of the wiring L1 serves as a terminal TE1.

Then, a semiconductor chip CHP is mounted in a chip mounting region of the base board BB. To be specific, the semiconductor chip CHP is mounted onto the base board BB such that the bump electrode BMP formed over the main surface of the semiconductor chip CHP comes in contact with the terminal TE1 formed over the base board BB. In other words, with the main surface of the semiconductor chip CHP facing the base board BB, flip-chip bonding is performed. As a result, the bump electrode BMP formed over the semiconductor chip CHP is electrically coupled with the terminal TE1 formed over the base board BB. Therefore, an integrated circuit formed inside the semiconductor chip CHP is electrically coupled with the wiring L1 through the contact between the bump electrode BMP and the terminal TE1. Thus, the semiconductor chip CHP is mounted onto the base board BB with the main surface of the semiconductor chip CHP facing downward. Therefore, the back surface of the semiconductor chip CHP faces upward. That is, the insulating film DAF formed over the back surface of the semiconductor chip CHP is arranged on the upper surface side.

Figure 27:
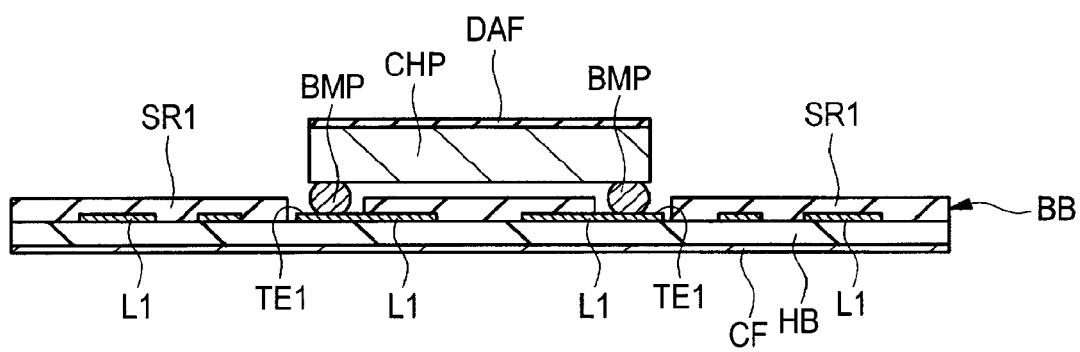
FIG. 27 is a cross-sectional view showing a step of the semiconductor device manufacturing process after the step shown in FIG. 26.
Figure 28:
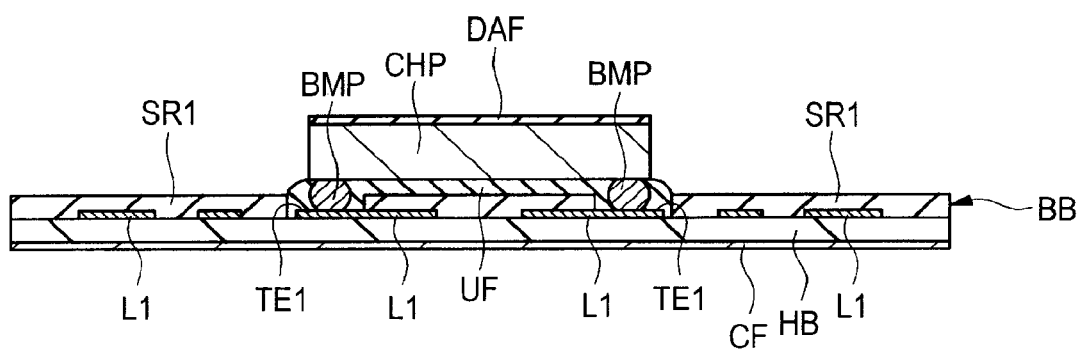
FIG. 28 is a cross-sectional view showing a step of the semiconductor device manufacturing process after the step shown in FIG. 27.

Then, as shown in FIG. 27, a ref low treatment (heat treatment) is performed. With this treatment, the bump electrodes BMP comprising solder formed over the semiconductor chip CHP are melted again. Thus, the bump electrode BMP comprising the solder is reliably coupled to the terminal TE1. Then, as shown in FIG. 28, a gap between the semiconductor chip CHP and the base board BB is filled with an underfill material UF. The step of charging the underfill UF material is performed while giving a heat treatment. Then, a bake treatment (heat treatment) is performed.

The rest of the step is the same as the step of producing the bump electrodes BMP comprising the gold material described above (see FIGS. 13 to 20). Thus, it becomes possible to manufacture the chip-embedded wiring board EMPAC1 according to Embodiment 1.

According to Embodiment 2, for example, before a stage where the semiconductor chip CHP of FIG. 28 is mounted onto the base board BB, the insulating film DAF comprising thermosetting resin is heat-treated. Hereafter, a flowchart shows a process from the step of preparing the semiconductor wafer WF to the step of mounting the semiconductor chip CHP onto the base board BB. Further, in which step a heat load is given to the insulating film DAF will be explained.

Figure 29:
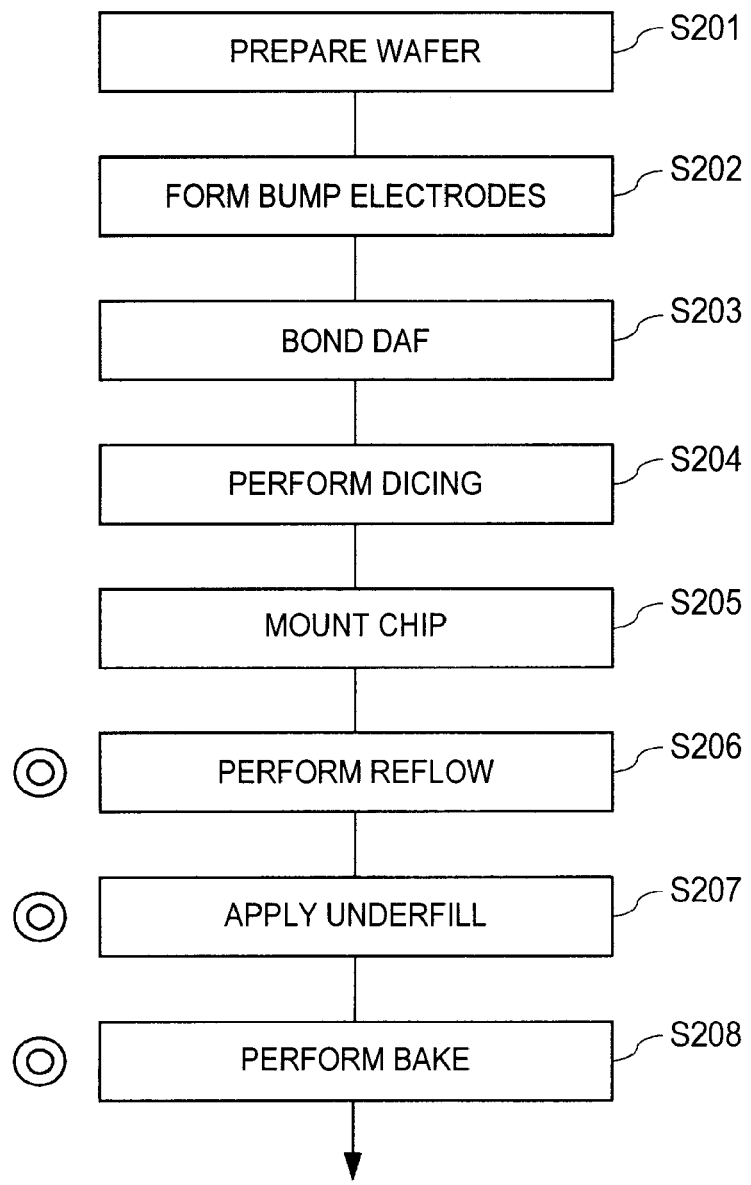
FIG. 29 is a flowchart showing a flow of the semiconductor device manufacturing process according to Embodiment 2.

FIG. 29 is a flowchart which shows a flow from the step of preparing the semiconductor wafer WF to the step of mounting the semiconductor chip CHP onto the base board BB. In FIG. 29, first, the semiconductor wafer WF is prepared (S201). Then, bump electrodes BMP comprising solder are formed over the main surface of the semiconductor wafer WF (S202). Next, the insulating film DAF comprising the thermosetting resin is bonded to the back surface of the semiconductor wafer WF (S203). Then, the dicing of the semiconductor wafer WF is performed (S204). Next, a base board BB is prepared, and the semiconductor chip CHP is mounted in a chip mounting region of the base board BB (S205). Then, a reflow treatment (heat treatment) is performed (S206). The reflow treatment is the heat treatment. Therefore, in this step, the insulating film DAF bonded to the back surface of the semiconductor chip CHP is heat-treated. Then, a gap between the semiconductor chip CHP and the base board BB is filled with an underfill material UF (S207). The step of charging the underfill material UF is performed while heating. Therefore, in this step, the insulating film DAF bonded to the back surface of the semiconductor chip CHP is heat-treated. Then, a bake treatment is performed (S208). The bake treatment is a heat treatment. Therefore, in this step, the insulating film DAF bonded to the back surface of the semiconductor chip CHP is heat-treated.

As described above, according to Embodiment 2, it is seen that in a stage from the step of preparing the semiconductor wafer WF to the step of mounting the semiconductor chip CHP onto the base board BB, the insulating film DAF is heat-treated in the steps marked by double circles in FIG. 29. Therefore, by undergoing the process from the step of preparing the semiconductor wafer WF to the step of mounting the semiconductor chip CHP onto the base board BB, the film quality of the insulating film DAF is more hardened than that of the insulating film DAF immediately after it is bonded to the back surface of the semiconductor wafer WF.

This shows that, according to Embodiment 2, before the stage in which the prepreg PG2A where the wiring L2 is formed is disposed over the insulating film DAF, the insulating film DAF can be heat-treated. For this reason, according to Embodiment 2, the wiring L2 is arranged over the insulating film DAF with the insulating film DAF comprising the thermosetting resins being cured. Therefore, even if a pressure treatment is given to the prepreg PG2A where the wiring L2 is formed, it is possible to prevent the wiring L2 from entering the insulating film DAF and coming into contact with the semiconductor chip CHP in a layer under the insulating film DAF.

Embodiment 3

Figure 30:
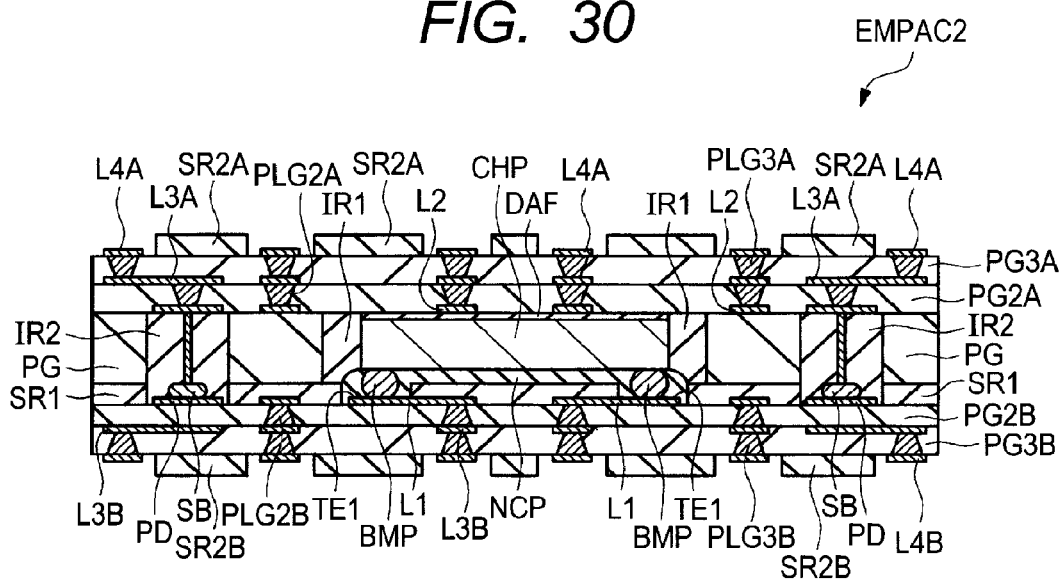
FIG. 30 is a cross-sectional view showing a configuration of a chip-embedded wiring board according to Embodiment 3.

In Embodiment 3, an explanation will be given of an example in which a through via is formed with use of stud bump electrodes. FIG. 30 is a cross-sectional view showing a configuration of a chip-embedded wiring board EMPAC2 according to Embodiment 3. The configuration of the chip-embedded wiring board EMPAC2 shown in FIG. 30 is substantially the same as the configuration of the chip-embedded wiring board EMPAC1 shown in FIG. 1. That is, in the chip-embedded wiring board EMPAC2 according to Embodiment 3 also, assuming that the bump electrodes BMP are formed over the main surface (element forming surface) of the semiconductor chip CHP, the insulating film DAF is formed over the back surface (a surface on the side opposite to the main surface) of the semiconductor chip CHP. Accordingly, it becomes unnecessary to form a prepreg PG over the back surface of the semiconductor chip CHP, which brings about an effect of thinning the chip-embedded wiring board EMPAC2 in which the semiconductor chip CHP is embedded.

In the case of the chip-embedded wiring board EMPAC2 of Embodiment 3 also, the wiring L2 can be formed, through the insulating film DAF, directly onto the back surface of the semiconductor chip CHP. That is, even in the case of the chip-embedded wiring board EMPAC2 of Embodiment 3, the region immediately above the back surface of the semiconductor chip CHP can be effectively used as a wiring forming region (wiring density can be raised). Therefore, miniaturization of the chip-embedded wiring board EMPAC2 can be attained. Thus, according to Embodiment 3 also, thinning and miniaturization of the chip-embedded wiring board EMPAC2 can be achieved.

On the other hand, as shown in FIG. 30, a feature peculiar to Embodiment 3 is that the stud bump electrode SB is used for a through via. Thus, by using the stud bump electrode SB for the through via, the size of the through via comprising the stud bump electrode SB can be made smaller. As a result, the miniaturization of the chip-embedded wiring board EMPAC2 can be attained.

The reason will now be explained. First, in the case of a conventional through via V1 shown in FIG. 1, its diameter is, for example, about 120 μm. Further, a diameter of a land to be coupled to an upper surface or a lower surface of the through via is, for example, about 210 μm. On the other hand, as shown in FIG. 30, when the stud bump electrode SB is used for the through via, a pad PD corresponding to the above land can be reduced to, for example, about 100 square μm. Therefore, the occupation area can be more reduced in the case of the through via of Embodiment 3 where the stud bump electrode SB is formed over the pad PD than in the case of a conventional through via V1 where the land is formed. That is, as in Embodiment 3, when the stud bump electrode SB is used for the through via, the area of the pad PD corresponding to the land can be reduced. Therefore, the size of the chip-embedded wiring board EMPAC2 can be reduced.

Figure 31:
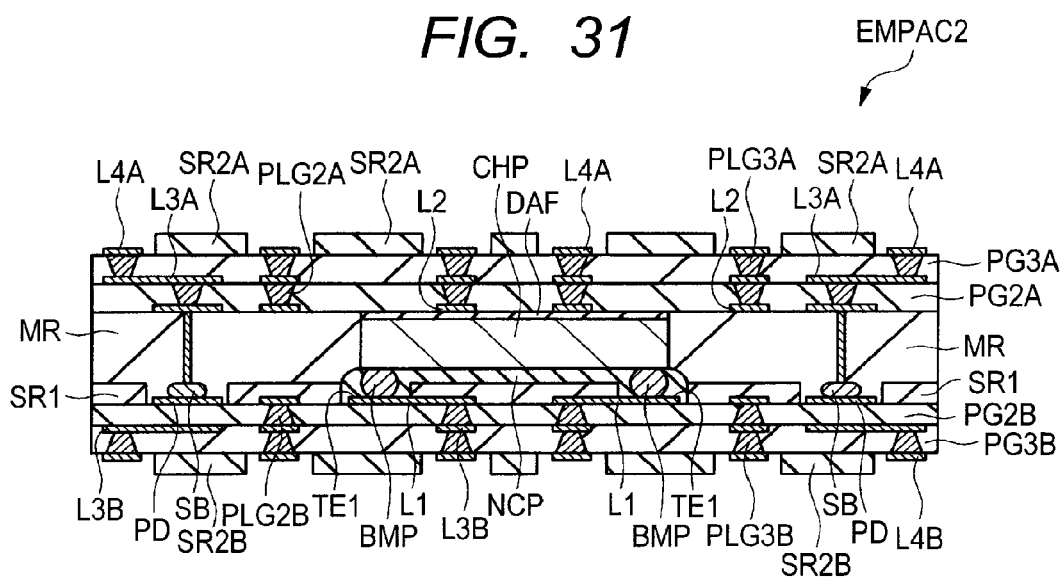
FIG. 31 is a cross-sectional view showing the configuration of the chip-embedded wiring board according to Embodiment 3.

The stud bump electrode SB whose size can be reduced is, as shown in FIG. 30, formed over the pad PD which is formed in the same layer as the wiring L1. Then, a gold wire is projected vertically from the stud bump electrode SB comprising a gold material, and the through via is formed thereby. The stud bump electrode SB is sandwiched by the prepreg PG, and is fixed by an insulating layer IR2 comprising an epoxy resin oozed out from the prepreg PG. Also, in FIG. 30, the prepreg PG is used as an interlayer insulating film for fixing the semiconductor chip CHP and the stud bump electrode SB to be a through via. However, as shown in FIG. 31, a mold resin MR may be used in place of the prepreg PG.

According to Embodiment 3, the through via is formed with use of the stud bump electrode SB. Such a configuration is particularly effective when applied to a configuration where the chip-embedded wiring board EMPAC2 is made thinner by forming an insulating film DAF over the back surface of the semiconductor chip CHP. That is, according to the configuration where the insulating film DAF is formed over the back surface of the semiconductor chip CHP, it becomes unnecessary to form the prepreg PG over the back surface of the semiconductor chip CHP. Therefore, the chip-embedded wiring board EMPAC2 in which the semiconductor chip CHP is embedded can be made thinner. This means that the through via formed in the chip-embedded wiring board EMPAC2 also becomes shorter, which also means that the through via using the stud bump electrode SB can be more applicable. That is, when the through via is long, the gold wire extending from the stud bump electrode SB becomes long, not being easily applicable. On the other hand, as in Embodiment 3, when the chip-embedded wiring board EMPAC2 can be made thinner, the gold wire extending from the stud bump electrode SB becomes shorter. Therefore, the stud bump electrodes can be applied more easily as the through via. However, the configuration where the stud bump electrodes SB are used as the through via can be applied to an ordinary configuration where the insulating film DAF is not formed over the back surface of the semiconductor chip CHP. For example, by stacking a plurality of stud bump electrodes SB in a vertical direction, the stud bump electrodes SB can be used as a long through via without allowing the gold wire to be long.

Embodiment 4

Figure 32:
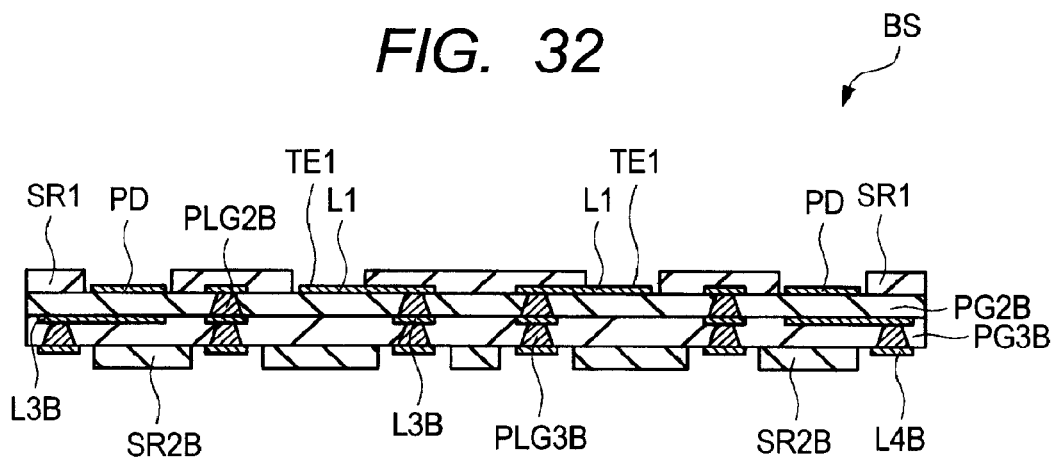
FIG. 32 is a cross-sectional view showing a step of a semiconductor device manufacturing process according to Embodiment 4.

According to Embodiment 4, a method of manufacturing the chip-embedded wiring board EMPAC2 of Embodiment 3 will be described with reference to the drawings. First, as shown in FIG. 32, a bottom substrate BS is prepared. A wirings L1 and a pad PD are formed in an upper layer of the bottom substrate BS, and a solder resist SR1 is formed in a portion above the wiring L1. The wiring L1 exposed from the solder resist SR1 serves as a terminal TE1. On the other hand, a prepreg PG2B is formed in a layer under the wiring L1, and a wiring L3B is formed in a layer under the prepreg PG2B. Then, a plug PLG2B is so formed as to pass through the prepreg PG2B. The wiring L1 and the wiring L3B are electrically coupled by the plug PLG2B. Furthermore, a prepreg PG3B is formed in a layer under the wiring L3B, and a wiring L4B is formed in a layer under the prepreg PG3B. Further, a plug PLG3B is so formed as to pass through the prepreg PG3B. The wiring L3B and the wiring L4B are electrically coupled by the plug PLG3B. Furthermore, a solder resist SR2B is formed in a layer under the prepreg PG3B.

Figure 33:
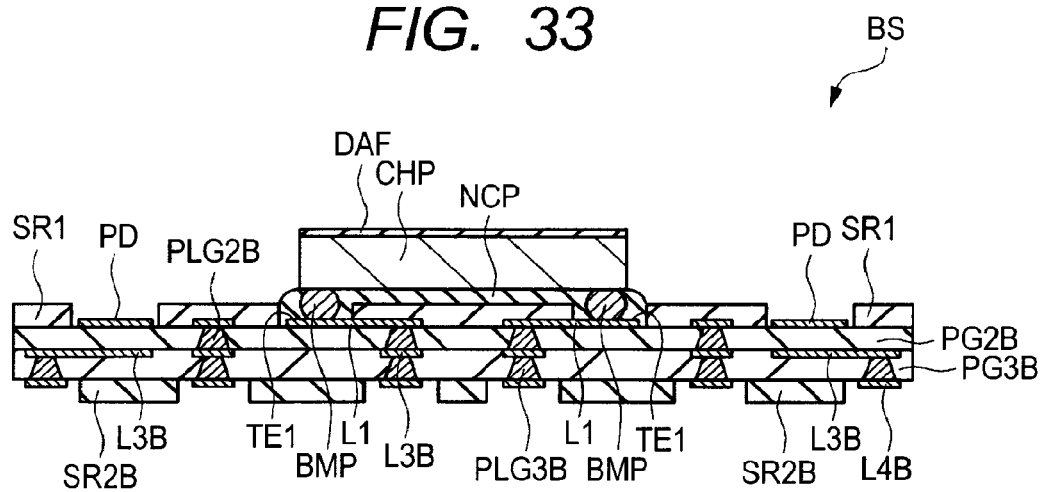
FIG. 33 is a cross-sectional view showing a step of the semiconductor device manufacturing process after the step shown in FIG. 32.

Next, as shown in FIG. 33, to the chip mounting region of the bottom substrate BS, a resin NCP to be an in-advance applying resin is applied. The resin NCP is so formed as to cover the wiring L1, solder resist SR1, and terminal TE1 formed in the chip mounting region.

Then, a semiconductor chip CHP is mounted in the chip mounting region of the bottom substrate BS to which the resin NCP is applied. The step of mounting the semiconductor chip CHP onto the bottom substrate BS is performed while heating. To be specific, the semiconductor chip CHP is mounted onto the bottom substrate BS such that the bump electrode BMP formed over the main surface of the semiconductor chip CHP is in contact with the terminal TE1 formed over the bottom substrate BS. In other words, the main surface of the semiconductor chip CHP is flip-chip bonded to the bottom substrate BS. As a result, the bump electrode BMP formed over the semiconductor chip CHP is electrically coupled with the terminal TE1 formed over the bottom substrate BS. Thus, an integrated circuit formed inside the semiconductor chip CHP is electrically coupled with the wiring L1 through the contact between the bump electrode BMP and the terminal TE1. Thus, the semiconductor chip CHP is mounted onto the bottom substrate BS with the main surface of the semiconductor chip CHP facing downward. Therefore, the back surface of the semiconductor chip CHP faces upward. That is, the insulating film DAF formed over the back surface of the semiconductor chip CHP is disposed on the upper surface side. Furthermore, after having mounted the semiconductor chip CHP onto the bottom substrate BS, cure bake (heat treatment) is performed. Also, for the bump electrode BMP, a gold material may be used. Alternatively, a solder material may be used.

Figure 34:
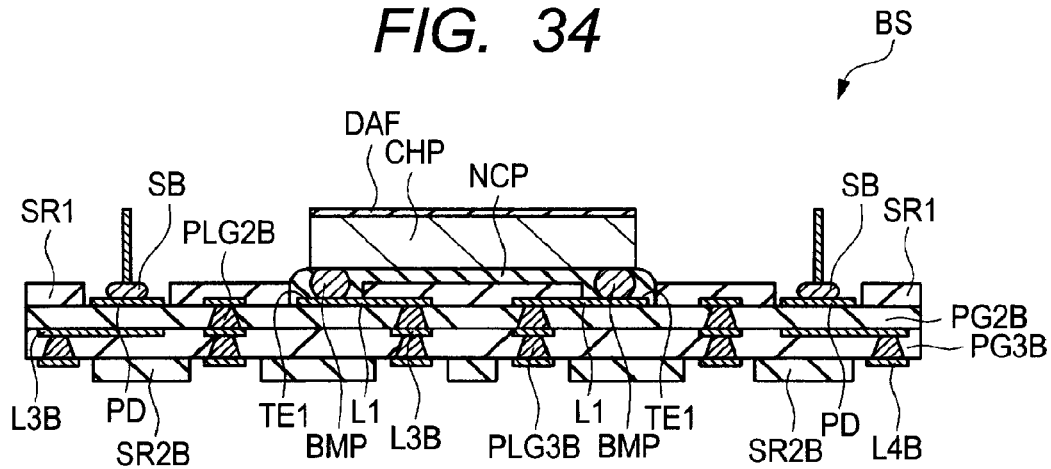
FIG. 34 is a cross-sectional view showing a step of the semiconductor device manufacturing process after the step shown in FIG. 33.

Next, as shown in FIG. 34, a stud bump electrode SB is formed over a pad PD. The stud bump electrode SB can be formed by using, for example, a capillary.

Here, there is prepared a prepreg PG to be an interlayer insulator of the chip-embedded wiring board EMPAC2. The prepreg PG is formed, for example, from a material in which a glass cloth is impregnated with epoxy resin. Then, by die-cutting the prepreg PG, a plurality of openings are formed in the prepreg PG. After that, onto the bottom substrate BS over which the semiconductor chip CHP is mounted, the prepreg PG with the openings is mounted. In this regard, the prepreg PG is arranged such that the semiconductor chip CHP is housed in one of the openings formed in the prepreg PG and that the stud bump electrode SB is housed in another opening. In addition, the size of the openings formed in the prepreg PG is larger than the size of the semiconductor chip CHP and the size of the stud bump electrode SB. For this reason, there is a gap formed between a side surface of the semiconductor chip CHP and a side surface of the prepreg PG. Also, a gap is formed between a side surface of the stud bump electrode SB and a side surface of the prepreg PG.

Then, the prepreg PG is shaped by applying heat and pressure to the prepreg PG formed over the bottom substrate BS. Because of the application of the heat and pressure at this time, an epoxy resin oozes out from the prepreg PG. The oozed-out epoxy resin fills the gap between the side surface of the semiconductor chip CHP and the side surface of the prepreg PG or the gap between the side surface of the stud bump electrode SB and the side surface of the prepreg PG. That is, an insulating layer IR1 and an insulating layer IR2 comprising the epoxy resin are formed in these gaps. Thus, over the bottom substrate BS, the prepreg PG, whose height coincides with a height of the semiconductor chip CHP and a height of the stud bump electrode SB, can be formed.

Then, as shown in FIG. 30, a top substrate is pasted to an upper surface of the prepreg PG, an upper surface of the semiconductor chip CHP, and the stud bump electrode whose heights coincide with one another. In regard to the top substrate, for example, as shown in FIG. 30, there is provided a wiring L2 and a prepreg PG2A is formed over the wiring L2. Further, a wiring L3A is formed over the prepreg PG2A. There is formed, in the prepreg PG2A, a plug PLG2A passing through the prepreg PG2A. Therefore, the wiring L2 and the wiring L3A are electrically coupled. Further, the wiring L3A is coupled with the pad PD through the stud bump electrode SB serving as a through via. Still further, in regard to the top substrate, a prepreg PG3A is formed over the wiring L3A. Also, a wiring L4A is formed over the prepreg PG3A. Still further, there is formed, in the prepreg PG3A, a plug PLG3A passing through the prepreg PG3A. The wiring L3A and the wiring L4A are electrically coupled by the plug PLG3A. Furthermore, a solder resist SR2A is formed over the prepreg PG3A. The top substrate configured as above is pasted to the upper surface of the prepreg PG, the upper surface of the semiconductor chip CHP, and over the stud bump electrode SB whose heights coincide with one another. Thus, the chip-embedded wiring board EMPAC2 of Embodiment 3 can be formed.

Figure 35:
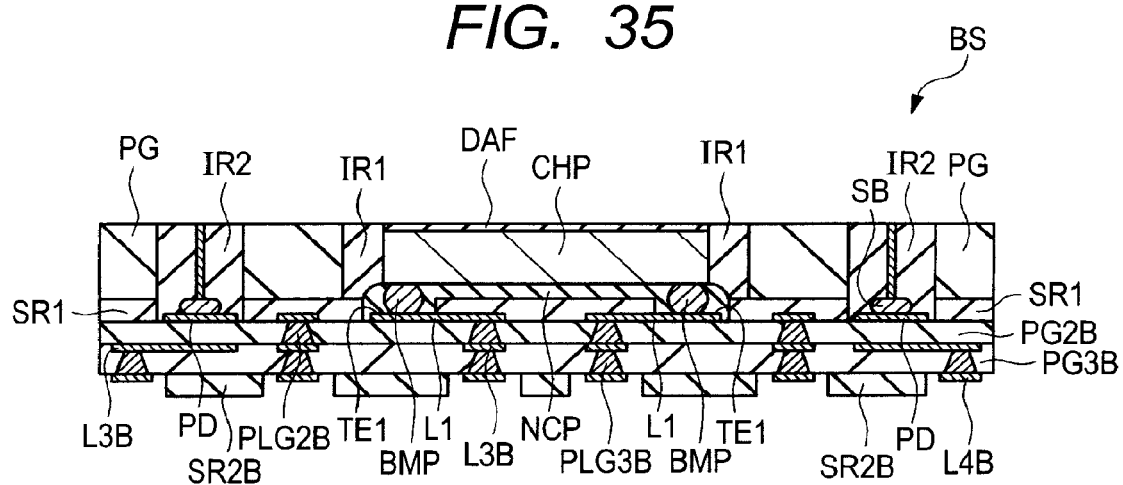
FIG. 35 is a cross-sectional view showing a step of the semiconductor device manufacturing process after the step shown in FIG. 34.
Figure 36:
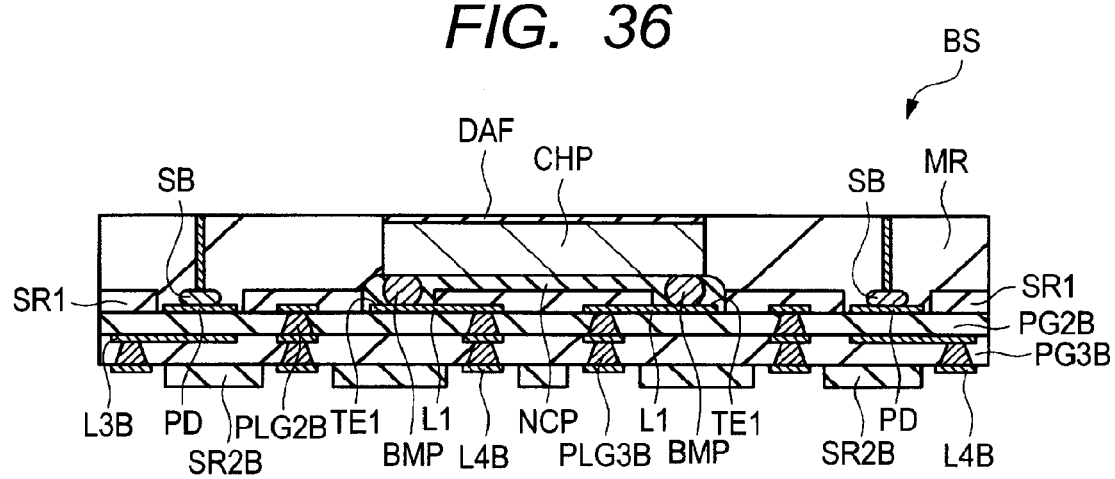
FIG. 36 is a cross-sectional view showing a step of the semiconductor device manufacturing process according to Embodiment 4.

In FIG. 35, an example of using the prepreg for the interlayer insulator has been explained. However, as shown in FIG. 36, a mold resin MR can be used for the interlayer insulator for fixing the semiconductor chip CHP and the stud bump electrode SB. In this case also, as shown in FIG. 31, the top substrate is pasted to an upper surface of the mold resin MR, the upper surface of the semiconductor chip CHP, and over the stud bump electrode SB whose heights coincide with one another so that the chip-embedded wiring board EMPAC2 of Embodiment 3 can be formed.

Embodiment 5

Figure 37:
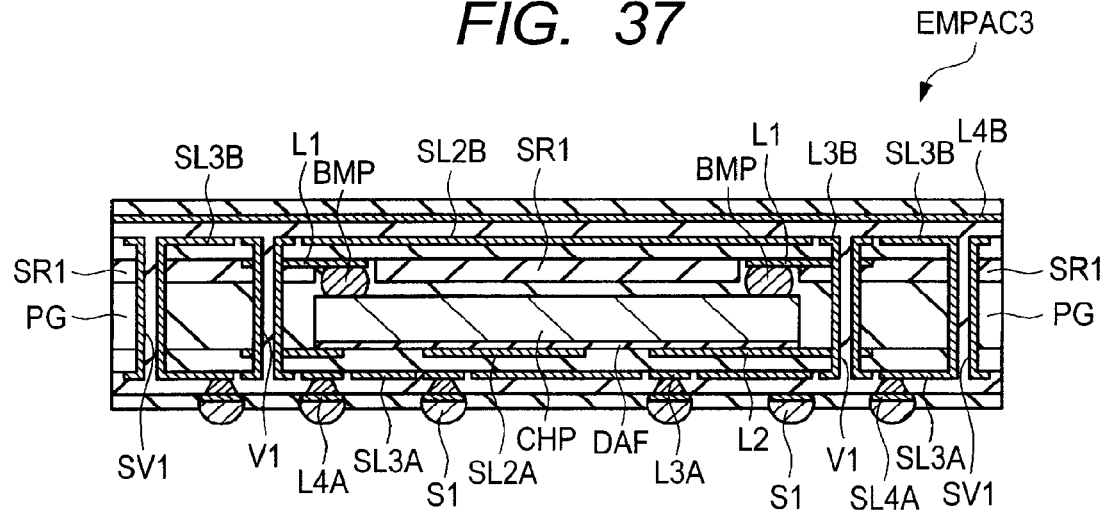
FIG. 37 is a cross-sectional view showing a configuration of a chip-embedded wiring board according to Embodiment 5.

In Embodiment 5, a chip-embedded wiring board EMPAC3 where an electromagnetic shield is formed will be explained. FIG. 37 is a cross-sectional view showing a configuration of the chip-embedded wiring board EMPAC3 according to Embodiment 5. The chip-embedded wiring board EMPAC3 shown in FIG. 37 includes the feature of the chip-embedded wiring board EMPAC1 shown in FIG. 1. That is, in the chip-embedded wiring board EMPAC3 of Embodiment 5 also, assuming that the bump electrode BMP is formed over the main surface (element forming surface) of the semiconductor chip CHP, the insulating film DAF is formed over the back surface (a surface which is on the side opposite to the main surface) of the semiconductor chip CHP. As a result, since it becomes unnecessary to form the prepreg PG over the back surface of the semiconductor chip CHP, the chip-embedded wiring board EMPAC3 in which the semiconductor chip CHP is embedded can be made thinner.

Even in the case of the chip-embedded wiring board EMPAC3 of Embodiment 5, it is possible to directly form the wiring L2, through the insulating film DAF, over the back surface of the semiconductor chip CHP. That is, even in the chip-embedded wiring board EMPAC3 of Embodiment 5, the region immediately above the back surface of the semiconductor chip CHP can be used effectively as the wiring forming region (wiring density can be raised). Therefore, the chip-embedded wiring board EMPAC3 can be made more compact. Thus, even in Embodiment 5, the chip-embedded wiring board EMPAC3 can be made thinner and more compact.

On the other hand, a feature peculiar to Embodiment 5 is that, in the chip-embedded wiring board EMPAC3, in addition to the conventional wirings L1, L2, L3A, L4A, L4B, and through via V1, there are formed shield wirings SL2A, SL2B, SL3A, SL3B, SL4A for shielding electromagnetic waves, and a through via SV1. The shield wirings SL2A, SL2B, SL3, SL3B, SL4A, and the through via SV1 are electrically coupled with one another and are so formed as to surround the semiconductor chip CHP. By applying ground potentials to the shield wirings SL2A, SL2B, SL3A, SL3B, SL4A, and the through via SV1, it becomes possible to suppress the outward leakage of the electromagnetic waves outputted from the semiconductor chip CHP. To be specific, in the case of the chip-embedded wiring board EMPAC3 of Embodiment 5, the wiring L4A and the shield wiring SL4A are formed in the lowest layer. The solder balls S1 are coupled to those wirings. Therefore, by supplying the ground potentials to the shield wiring SL4A from an external device coupled to the solder ball S1, the ground potentials can be supplied to the shield wirings SL2A, SL2B, SL3A, SL3B, SL4A, and the through via SV1, which are electrically coupled with one another. Thus, they are allowed to function as electromagnetic field shields.

The chip-embedded wiring board EMPAC3 according to Embodiment 5 is particularly useful for the case where a semiconductor chip CHP using high frequency signals such as an RFIC chip is embedded. Since the semiconductor chip CHP using high frequency signals emits a great deal of electromagnetic waves, by surrounding the embedded semiconductor chip CHP with the shield wirings SL2A, SL2B, SL3A, SL3B, SL4A, and the through via SV1, it becomes possible to keep the electromagnetic waves emitted from the semiconductor chip CHP from leaking outside.

Embodiment 6

Figure 38:
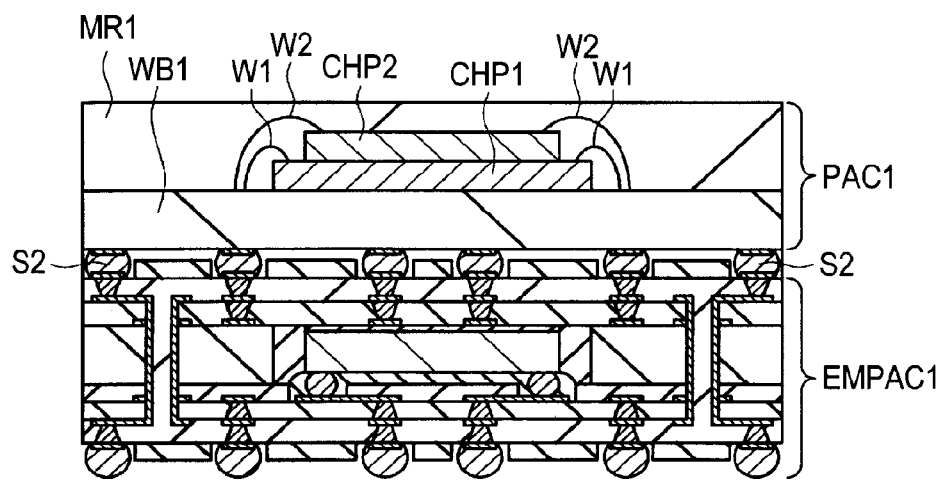
FIG. 38 is a cross-sectional view showing a configuration of a semiconductor device according to Embodiment 6.

According to Embodiment 6, an explanation will be given of what is called a POP configuration (Package On Package) where a package PAC1 is mounted onto the chip-embedded wiring board EMPAC1 (see FIG. 1). FIG. 38 is a cross-sectional view showing a configuration of a semiconductor device according to Embodiment 6. In FIG. 38, solder balls are mounted in a lowest layer of chip-embedded wiring board EMPAC1. Also, a package PAC1 is mounted over the upper part of the chip-embedded wiring board EMPAC1. At this time, the chip-embedded wiring board EMPAC1 and the package PAC1 are electrically coupled by the solder balls S2.

The configuration of the chip-embedded wiring board EMPAC1 of Embodiment 6 is the same as the one shown in FIG. 1 of Embodiment 1. Next, an explanation will be given of the configuration of the package PAC1 mounted over the chip-embedded wiring board EMPAC1. In FIG. 38, the package PAC1 has a wiring board WB1. A semiconductor chip CHP1 and a semiconductor chip CHP2 are mounted over the wiring board WB1 in a stacked manner. The wiring board WB1 (terminal) and the semiconductor chip CHP1 (pad) are coupled with wires W1, and the wiring board WB1 (terminal) and the semiconductor chip CHP2 (pad) are coupled with wires W2. The semiconductor chip CHP1, semiconductor chip CHP2, wires W1, and wires W2 are sealed with a mold resin MR1. The semiconductor device of Embodiment 6 is configured as above. With reference to a comparative example, its advantage will be explained below.

Figure 39:
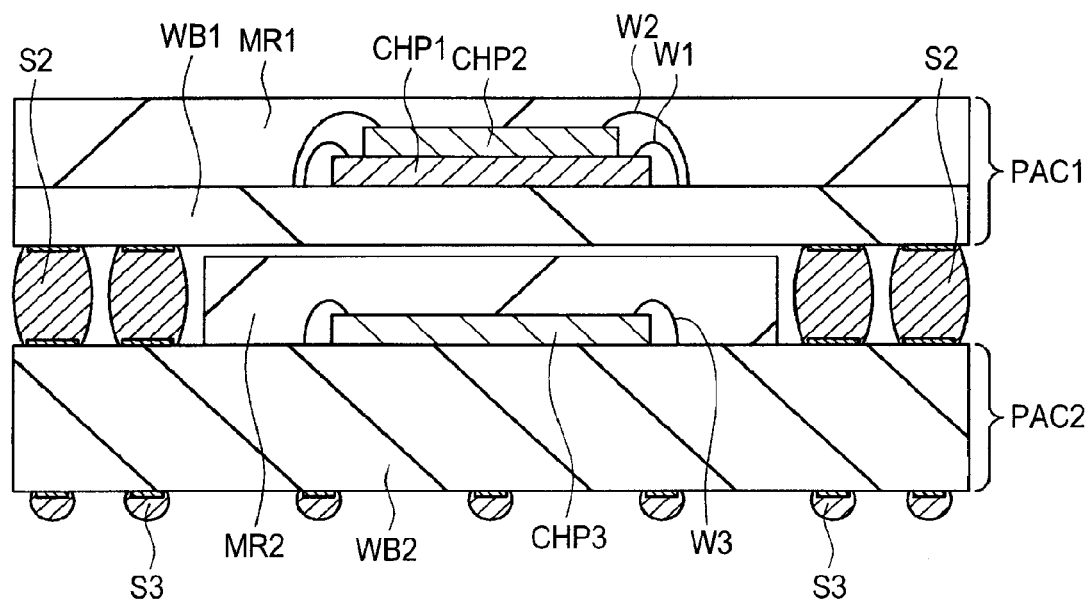
FIG. 39 is a cross-sectional view showing a configuration of a semiconductor device of a comparative example.

FIG. 39 is a cross-sectional view showing a semiconductor device of the comparative example. In FIG. 39, in the semiconductor device of the comparative example, a package PAC1 is mounted over a package PAC2. At this time, the package PAC1 and the package PAC2 are the ones in a normal state (for example, BGA (Ball Grid Array)). The package PAC2 formed in a lower layer has a wiring board WB2. A solder ball S3 used as an external coupling terminal is formed over an undersurface of the wiring board WB2. On the other hand, a semiconductor chip CHP3 is mounted over an upper surface of the wiring substrate WB2. The semiconductor chip CHP3 (pad) and the wiring substrate WB2 (terminal) are coupled with a wire W3. Then, the semiconductor chip CHP3 and the wire W3 are sealed with a mold resin MR2. Further, the package PAC1 is mounted over the package PAC2.

On the other hand, the package PAC1 formed in the upper layer has the wiring board WB1. The semiconductor chip CHP1 and the semiconductor chip CHP2 are disposed over the wiring board WB1 in a stacked manner. Then, the wiring board WB1 (terminal) and the semiconductor chip CHP1 (pad) are coupled by the wire W1, and the wiring board WB1 (terminal) and the semiconductor chip CHP2 (pad) are coupled by the wire W2. Further, the semiconductor chip CHP1, semiconductor chip CHP2, wire W1, and wire W2 are sealed with the mold resin MR1.

The package PAC2 formed in the lower layer and the package PAC1 which are formed in the upper layer are coupled by the solder balls S2. At this time, in the comparative example, in order to electrically couple the package PAC1 with the package PAC2, for example, in the package PAC2 disposed in the lower layer, the wiring board WB2 has to be extended further to the outside of the mold resin MR2 which seals the semiconductor chip CHP3. That is, in order to secure a region for coupling the package PAC1 with the package PAC2, in the comparative example, it is necessary to make the size of the package PAC2 to be larger than the size of the mold resin MR2, for example. Then, in order to electrically couple the package PAC2 formed in the lower layer with the package PAC1 formed in the upper layer, the size of the package PAC1 also has to be made larger. That is, in the comparative example, in order to secure the region for electrically coupling the package PAC2 formed in the lower layer with the package 1 formed in the upper layer, the package size becomes inevitably large. Furthermore, the package PAC2 also becomes thicker as compared to the chip-embedded wiring board EMPAC1 (see FIG. 38).

On the other hand, in the semiconductor device according to Embodiment 6, as shown in FIG. 38, a semiconductor chip is embedded inside the chip-embedded wiring board EMPAC1. Thus, the semiconductor chip is not disposed in an upper part of the chip-embedded wiring board EMPAC1. For this reason, unlike the comparative example, it is not necessary to provide a region for coupling one package with another outside the region in which the semiconductor chip CHP3 is formed. That is, as shown in FIG. 38, all the areas of the upper surface of the chip-embedded wiring board EMPAC1 can be used as the region for coupling one package with another. Therefore, in the chip-embedded wiring board EMPAC1 of Embodiment 6, unlike the comparative example, it is not necessary to enlarge the size of the package PAC2. Therefore, as compared to the comparative example, the semiconductor device of Embodiment 6 is advantageous in that it is possible to miniaturize the POP-type semiconductor device. Furthermore, in the chip-embedded wiring board EMPAC1 of Embodiment 6, as explained in Embodiment 1, thinning was achieved by forming the insulating film over the back surface of the semiconductor chip. From this aspect, the semiconductor device of Embodiment 6 is advantageous in that the semiconductor device having the POP configuration can be also made thinner.

Moreover, in a comparative example shown in FIG. 39, regarding the package PAC2 formed in the lower layer, over a wiring board WB2, there is formed the mold resin MR2 which seals the semiconductor chip CHP3. That is, although the mold resin MR2 is not formed under the wiring board WB2, the mold resin MR2 is formed on the upper side of the wiring board WB2. In this regard, the coefficient of thermal expansion of the wiring board WB2 and that of the mold resin MR2 are different. Therefore, if the mold resin MR2 is formed on one side of the wiring board WB alone, a bend is likely to occur because of the difference between the two coefficients of thermal expansion. Thus, the package PAC2 is configured such that the bend is likely to occur. When the bend occurs in the package PAC2, a failure is likely to occur in the coupling between the package PAC1 and the package PAC2.

On the other hand, according to Embodiment 6 shown in FIG. 38, the semiconductor chip is embedded in a central part of the chip-embedded wiring board. Further, in the upper and lower portions of the semiconductor chip, there are almost evenly formed interlayer insulating films comprising prepreg. That is, the chip-embedded wiring board EMPAC1 of Embodiment is configured symmetrically, with a spot where the semiconductor chip CHP is embedded as a center, in a thickness direction. This means that a bend is not likely to occur in the chip-embedded wiring board EMPAC1. Therefore, as in the POP configuration of Embodiment 6 where the package PAC1 is mounted over the chip-embedded wiring board EMPAC1, it is seen that a failure in coupling due to a bend of the chip-embedded wiring board EMPAC1 can be suppressed. That is, it is seen that, as compared to the comparative example, the semiconductor device according to Embodiment 6 is advantageous in that a fault in coupling between the packages due to a bend can be suppressed.

Embodiment 7

Figure 40:
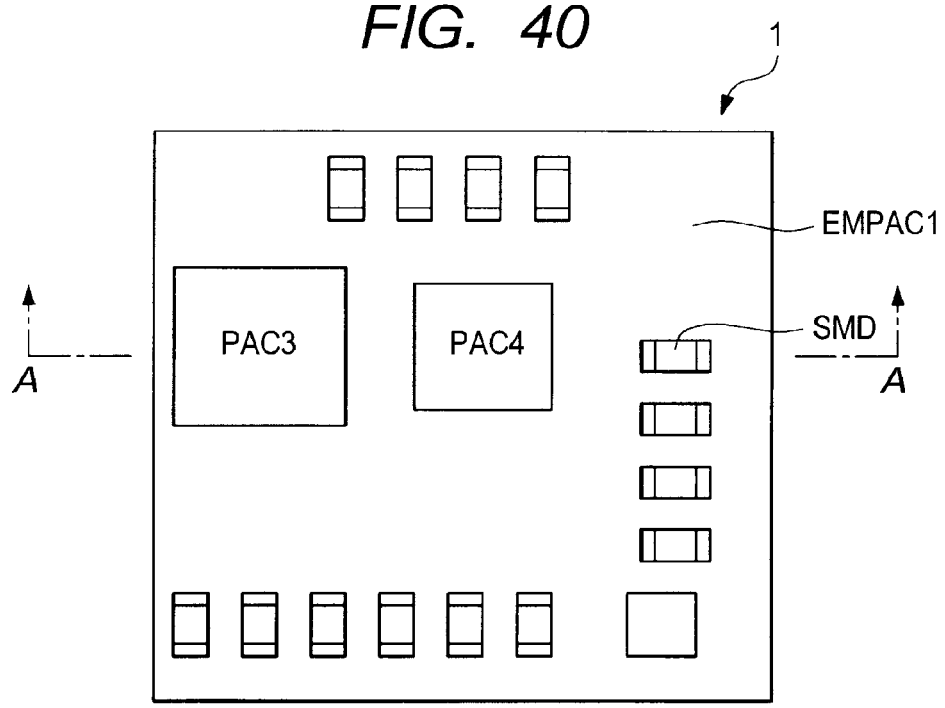
FIG. 40 is a plan view showing a configuration of a semiconductor device according to Embodiment 7.

In Embodiment 7, an explanation will be given of an example in which a semiconductor device is configured such that a package and passive parts are mounted over an upper portion of the chip-embedded wiring board EMPAC1 (see FIG. 1). FIG. 40 is a plan view showing a configuration of the semiconductor device according to Embodiment 7. As shown in FIG. 40, over the surface of the chip-embedded wiring board EMPAC1 in the form of a rectangle, there are mounted a package PAC3, a package PAC4, and a plurality of passive parts SMD. In the package PAC3 and the package PAC4 mounted over the chip-embedded wiring board EMPAC1, for example, there are sealed semiconductor chips having different functions.

Figure 41:
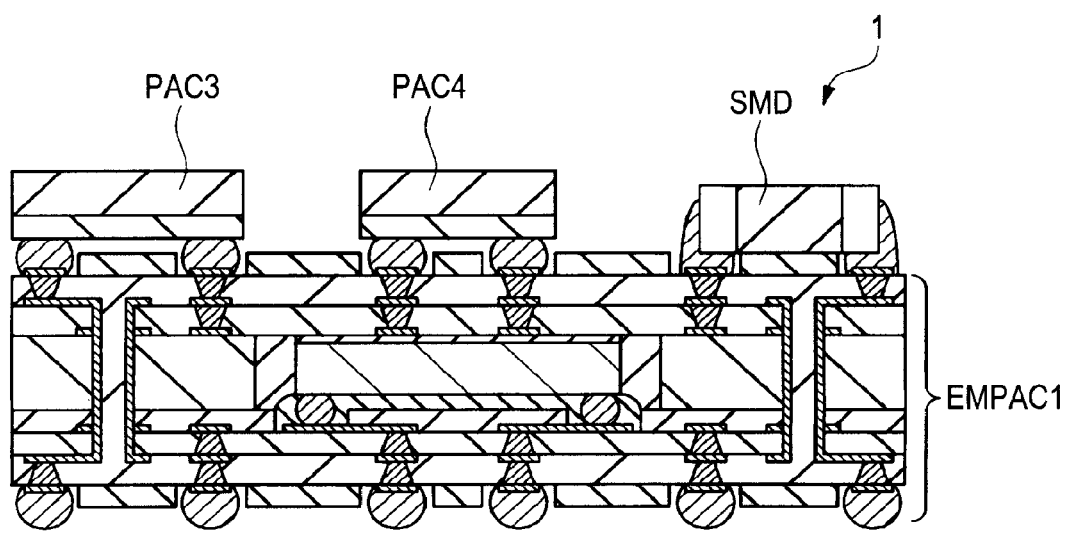
FIG. 41 is a cross-sectional view taken along line A-A in FIG. 40.

FIG. 41 is a cross-sectional view taken along line A-A in FIG. 40. As shown in FIG. 41, over the chip-embedded wiring board EMPAC1, there are coupled the package PAC3, package PAC4, and passive parts SMD by solder. Thus, the semiconductor device of Embodiment 7 can be formed. According to the semiconductor device of Embodiment 7, it is possible to embed the semiconductor chip in the chip-embedded wiring board EMPAC1. At the same time, it is also possible to mount the package PAC3, package PAC4, and passive parts SMD over the surface thereof. For example, a cellular phone requires a plurality of semiconductor chips such as a baseband IC chip, an RFIC chip, a power amplifier IC chip, and the like. However, by mounting those semiconductor chips onto the single chip-embedded wiring board EMPAC1, miniaturization of the cellular phone can be attained.

Although the invention made by the inventors has been specifically described above based on the exemplary embodiments, it will be understood by those skilled in the art that the invention is not limited thereto, and that various modifications can be made without departing from the spirit and scope of the invention.

The present invention can be widely used in the semiconductor device manufacturing industry.

What is claimed is:

1. A method of manufacturing a semiconductor device, comprising the steps of:
   (a) preparing a semiconductor chip where a bump electrode is formed over a main surface and a thermosetting insulating film is formed over a back surface;
   (b) preparing a base board which serves as a core of a multilayered wiring board and in which a first internal wiring is formed;
   (c) coupling the bump electrode formed over the semiconductor chip with the first internal wiring by mounting the semiconductor chip in a chip mounting region of the base board;
   (d) after the step (c), performing a reflow treatment which is a heat treatment;
   (e) after the step (d), applying an underfill material into a gap between the semiconductor chip and the base board;
   (f) after the step (e), applying a heat treatment;
   (g) after the step (f), forming a first interlayer insulator so as to cover a side surface of the semiconductor chip and to allow the insulating film formed over the back surface, which is on an upper surface side of the semiconductor chip, to be exposed; and
   (h) after the step (g), forming a second interlayer insulator covering from the first interlayer insulator to the semiconductor chip so that the conductive film may come in contact with the insulating film, the patterned conductive film being pasted to the upper part of the second interlayer insulator, and forming a second internal wiring comprising the conductive film so as to be directly in contact with the insulating film,
   wherein, by being heated in the steps (d), (e), and (f), in a stage before the step (h), the insulating film is more cured than the insulating film in the step (a).

2. A method of manufacturing a semiconductor device according to claim 1,
   wherein the insulating film is a die attach film.

3. A method of manufacturing a semiconductor device according to claim 1,
   wherein the insulating film comprises a liquid resin.

4. A method of manufacturing a semiconductor device according to claim 1,
   wherein the bump electrode comprises a solder material.

5. A method of manufacturing a semiconductor device according to claim 1,
   wherein the first and second interlayer insulators comprise prepreg, and
   wherein the conductive film includes a copper film.

6. A method of manufacturing a semiconductor device according to claim 1,
   wherein after the step (f), before the step (g), a stud bump electrode is formed over the base board with use of a capillary, and
   wherein, in the step (g), a through via comprising the stud bump electrode is formed in the first interlayer insulator by forming the first interlayer insulator so as to sandwich the stud bump electrode.

* * * * *